United States Patent
Chakraborty et al.

(10) Patent No.: US 10,833,685 B1
(45) Date of Patent: Nov. 10, 2020

(54) LINEARIZED WIDE TUNING RANGE OSCILLATOR USING MAGNETIC BALUN/TRANSFORMER

(71) Applicant: International Business Machines Corporation, Armonk, NY (US)

(72) Inventors: Sudipto Chakraborty, Plano, TX (US); Rajiv Joshi, Yorktown Heights, NY (US); Steven J. Holmes, Ossining, NY (US); Bruce B. Doris, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/445,898

(22) Filed: Jun. 19, 2019

(51) Int. Cl.
*H03L 7/089* (2006.01)
*H03B 5/12* (2006.01)

(52) U.S. Cl.
CPC ........... *H03L 7/0898* (2013.01); *H03B 5/124* (2013.01); *H03B 5/1296* (2013.01)

(58) Field of Classification Search
CPC .................................................... H03L 7/0898
USPC ...................................................... 331/117 FE
See application file for complete search history.

(56) References Cited

U.S. PATENT DOCUMENTS

| | | |
|---|---|---|
| 7,532,001 B2 | 5/2009 | Lee et al. |
| 8,325,001 B2 | 12/2012 | Huang et al. |
| 9,744,858 B2 | 8/2017 | Hall et al. |
| 10,170,996 B2 | 1/2019 | Bronson et al. |
| 2013/0214870 A1* | 8/2013 | Mangraviti ............ H03B 5/08 331/117 R |
| 2014/0368285 A1* | 12/2014 | Lu ........................ H03B 5/1228 331/117 FE |

(Continued)

FOREIGN PATENT DOCUMENTS

| | | |
|---|---|---|
| CN | 107592076 A | 1/2018 |
| WO | WO2014152004 A1 | 9/2014 |

OTHER PUBLICATIONS

Lightbody, "Transformer-enhanced High-performance Voltage-controlled Oscillators", Dissertation: The University of British Columbia, Vancouver, Aug. 2018, 50 pages.

(Continued)

*Primary Examiner* — Joseph Chang
(74) *Attorney, Agent, or Firm* — Scully, Scott, Murphy & Presser, P.C.; Daniel P. Morris, Esq.

(57) ABSTRACT

A voltage controlled oscillator (VCO) circuit and method achieves linearized frequency tuning over an extended range of analog tuning voltage by implementing a magnetic balun/transformer for biasing and coupling varactor elements. An active negative transconductance circuit of cross-coupled transistors have drains connected with a resonant tank circuit and at least a first varactor element having ends connected to respective first ends of respective first coils of a respective first and second magnetic balun. Respective second ends of respective first coils of respective first and second baluns are connected to a first reference supply voltage. A second varactor element has ends connecting respective first ends of respective second coils of said first and second baluns. A sinking of a bias current through the resonant tank circuit and the transconductance circuit generates an oscillating signal. A calibration method achieves precise VCO gain over wide tuning voltage range, thereby enhancing VCO linearity.

20 Claims, 15 Drawing Sheets

(56) References Cited

U.S. PATENT DOCUMENTS

2016/0056762 A1* 2/2016 Ximenes .............. H03B 5/1265
331/117 FE

OTHER PUBLICATIONS

Lightbody et al., "!-195 dBc/Hz FoMT20.8-to-28-GHz LC VCO with Transformer-Enhanced 30% Tuning Range in 65-nm CMOS", 2018 IEEE Radio Frequency Integrated Circuits Symposium (RFIC), Jun. 10-12, 2018, Philadelphia, PA, pp. 200-203.
Zhao et al., "A tunable metamaterial absorber using varactor diodes", New Journal of Physics, 15 (2013), Apr. 2013, pp. 1-11.

* cited by examiner

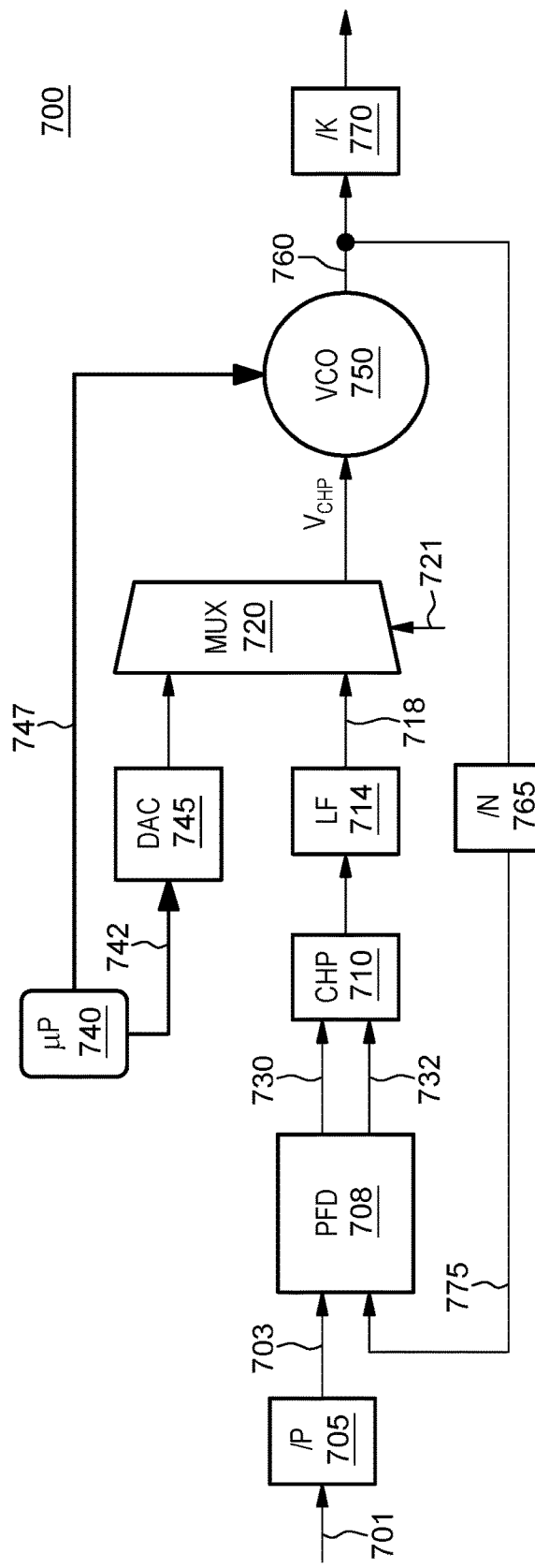
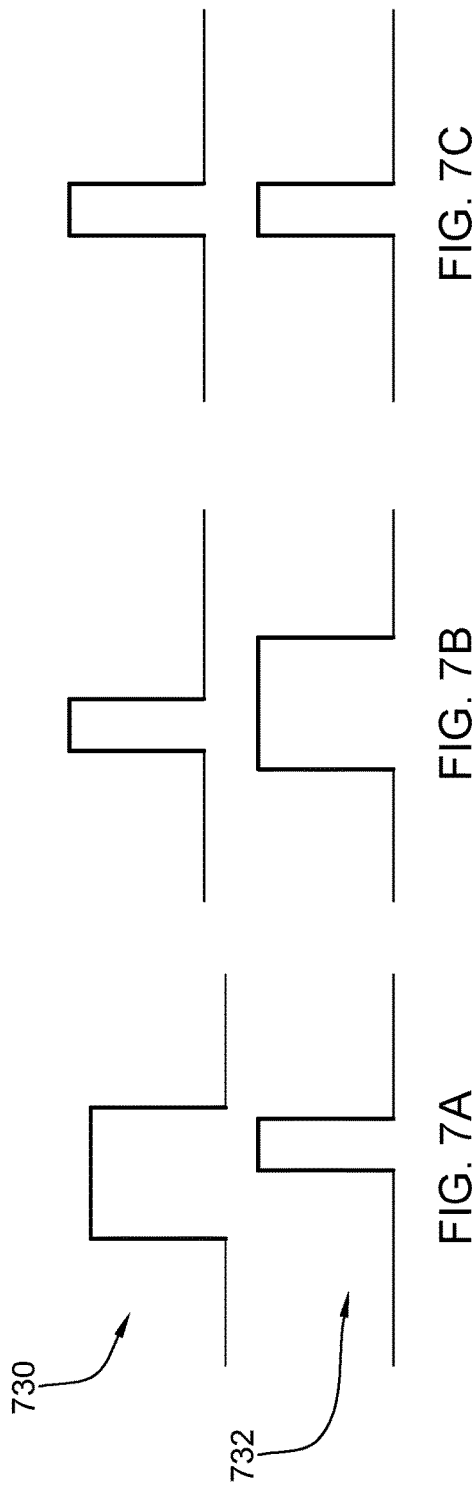
FIG. 7
FIG. 7A
FIG. 7B
FIG. 7C

US 10,833,685 B1

LINEARIZED WIDE TUNING RANGE OSCILLATOR USING MAGNETIC BALUN/TRANSFORMER

FIELD

The present application relates to electronic oscillator circuits generally, and in particular, to a wide tuning range oscillator using a magnetic balun/transformer to bias varactors and a method of operation.

BACKGROUND

Linearized voltage control oscillators (VCOs) are needed for wide tuning phase locked loops (PLLs). Traditional method employs a capacitive coupling of a plurality of varactors to the oscillator tank, and provides DC bias voltages through large resistors. This existing method leads to lower tuning range due to large parasitic capacitances, and higher power consumption due to reduction in Q factor.

FIG. 1 shows a voltage controlled oscillator (VCO) circuit 10 according to a conventional implementation in which oscillator circuit includes a cross-coupled metal-oxide-semiconductor (MOS) field effect transistor (FET) configuration 25 including an internal pair of MOS transistor M1 and MOS transistor M2 each having a gate, drain (D) and source (S) terminals, where the gates of each M1, (M2) device are connected to the drains (D) of the opposite device M2, (M1). A current source supplied by voltage supply VDD provides biasing current to operate each M1, M2 device through a respective connected individual inductor L1, L2. The source terminals (S) of respective MOS transistors M1, M2 are connected together via a conductor and a bias current sink 50 further connects these source terminals (S) of the respective transistors M1, M2 to provide a tale current through M1, M2 to ground.

The load or oscillator output is connected across the drains of the cross-coupled pair. As known, a cross coupled transconductance pair of MOSFETs structure provide a negative resistance (negative transconductance) such that, in the presence of connected passive inductance and capacitance components provides a condition for oscillation when the negative gm structure compensates for the losses occurring due to the passive elements.

Further, as known, one way to control a center frequency of oscillation in the VCO device 10 of FIG. 1 in discrete frequency steps, is to digitally control one or more passive components (typically capacitors) in the tank circuit (e.g., a digital tuning). More typically, the controlling of a center frequency of oscillation in the VCO device 10 in continuous manner is to program a voltage variable capacitor, or varactor, which can continuously change the capacitance value as applied voltage to the capacitor is changed continuously, which tunes the oscillator center frequency (e.g., analog tuning). The amplitude of the VCO is controlled by the quiescent current, and the impedance of the passive network (parallel combination of inductor and capacitor)

As shown in FIG. 1, the cross-coupled MOS transistors of oscillator circuit 10 are connected in parallel with an oscillator LC tank circuit including the inductor elements L tied to VDD and a parallel configuration of series connected capacitors that couple alternating current (AC) signals including a first series connection of capacitors 35 connecting drain terminals (D) of cross-coupled transistors M1, M2 and a parallel connection of a second series connection of capacitors 45 connecting drain terminals (D) of M1, M2. In an embodiment, each first and second series 35, 45 of the parallel stack includes three capacitors connected in a series. In series connection 35, the second capacitor of the series is a connected varactor C1(V); likewise, in series connection 45, the second capacitor of the series is a connected varactor C2(V), with each varactor being connected to separate or same tuning voltage sources supplying respective bias voltage V1 and V2 to respective varactors C1(V), C2(V) via respective biasing (DC voltage) resistors. The voltage sources supplying respective bias voltage V1 and V2, can be generated on chip 20 and 30.

In the conventional configuration of the VCO 10 shown in FIG. 1, the need for large capacitor and resistance elements R, C resulting in large parasitic capacitances which reduces linear frequency tuning range. Moreover, the coupling of the plurality of varactors in the tank circuit oscillator requires separate biasing, which further reduces "Q factor" (loss of quality factor (Q)) which reduces oscillation margin, increases power consumption and jitter.

As the capacitance of a varactor (e.g., $C1(v)$, $C2(v)$) changes with voltage applied to it, capacitance varies between a minimum capacitance ($C_{min}$) and a maximum capacitance ($C_{max}$). With technology scaling, a quantity:

$$\frac{C\text{max}}{C\text{min}}$$

is reduced, leading to a small range for linear C(v) operation.

SUMMARY

Aspects of the invention provide an electronic oscillator circuit having a magnetic balun/transformer structure for biasing variable capacitor (varactor) elements to achieve linearized tuning of the oscillator over a wider range of tunable center frequencies.

Aspects of the invention further include a method of operating an electronic oscillator circuit having a magnetic balun/transformer structure for biasing variable capacitor (varactor) elements to achieve linearized wide continuous tuning of the oscillator over a wide range of frequencies.

In one aspect the magnetic balun/transformer structure is laterally coupled or vertically coupled magnetic transformer.

In an embodiment, a phase lock loop circuit and operating method is provided employing electronic oscillator circuit having a magnetic balun/transformer structure for biasing variable capacitor (varactor) elements to achieve linearized tuning of the oscillator over a wide range of frequencies.

In accordance with a first aspect of the invention, there is provided a voltage controlled oscillator (VCO) comprising: an active negative transconductance circuit comprising: cross-coupled transistors having drains connected with a resonant tank circuit; the resonant tank circuit comprising: a first variable capacitor element having first and second ends connected to respective first ends of respective first coils of a respective first and second magnetic balun, and respective second ends of respective first coils of respective first and second magnetic baluns being connected to a first reference supply voltage; and a second variable capacitor element having first and second ends connected to respective first ends of respective second coils of the respective first and second magnetic baluns, and respective second ends of respective second coils of respective first and second magnetic baluns being connected to a second reference supply voltage, and a bias current circuit for sourcing or sinking a bias current through the resonant tank circuit and the active negative transconductance circuit to generate an oscillating signal, the tank circuit providing a low parasitic capacitance coupling structure and the first and second reference supply voltages each providing a voltage offset for extending a tuning range of the oscillator.

In accordance with a further aspect of the invention, there is provided a voltage controlled oscillator (VCO), comprising: a first active negative transconductance circuit comprising: cross-coupled transistors having drains connected with a resonant tank circuit; the resonant tank circuit comprising: a second active negative transconductance circuit comprising: cross-coupled transistors having drains connected with the resonant tank circuit; a first variable capacitor element having first and second ends connected to respective first ends of respective first coils of a respective first and second magnetic balun, and respective second ends of respective first coils of respective first and second magnetic baluns being connected to a reference supply voltage; a second variable capacitor element having first and second ends connected to respective first ends of respective second coils of the respective first and second magnetic baluns, and respective second ends of respective second coils of respective first and second magnetic baluns being connected to a virtual signal ground, wherein the second active negative transconductance circuit drains connect to the respective first ends of respective second coils of the respective first and second magnetic baluns; and a bias current circuit for sourcing or sinking a bias current through the resonant tank circuit, the first active negative transconductance circuit and the second active negative transconductance circuit to generate an oscillating signal, the tank circuit providing a low parasitic capacitance coupling structure and the reference supply voltage providing a voltage offset for extending a tuning range of the oscillator.

In accordance with a further aspect of the invention, there is provided a method of operating a voltage controlled oscillator (VCO). The method comprises: receiving a bias current at an active circuit comprising cross-coupled transistors having drains connected with a resonant tank circuit, the active circuit presenting a negative transconductance condition for generating an oscillating signal responsive to the bias current, the tank circuit comprising: a first variable capacitor element having first and second ends connected to respective first ends of respective first coils of a respective first and second magnetic balun, and a second variable capacitor element having first and second ends connected to respective first ends of respective second coils of the respective first and second magnetic baluns; applying a first bias voltage to the first variable capacitor element via respective second ends of respective first coils of the respective first and second magnetic balun; and applying a second bias voltage to the second variable capacitor element via respective second ends of respective second coils of the respective first and second magnetic balun, the first and second bias voltages each providing a voltage offset for extending a tuning range of the oscillator.

BRIEF DESCRIPTION OF THE DRAWINGS

FIG. 7 depicts a phase lock loop circuit in which an embodiment of the voltage controlled oscillator of the present invention is employed;

FIGS. 7A-7C depict various PLL states of the VCO and the relation between UP and DOWN signals detected by a phase frequency detector used when tuning the VCO center frequency in steady state operation;

DETAILED DESCRIPTION

Figure 1:
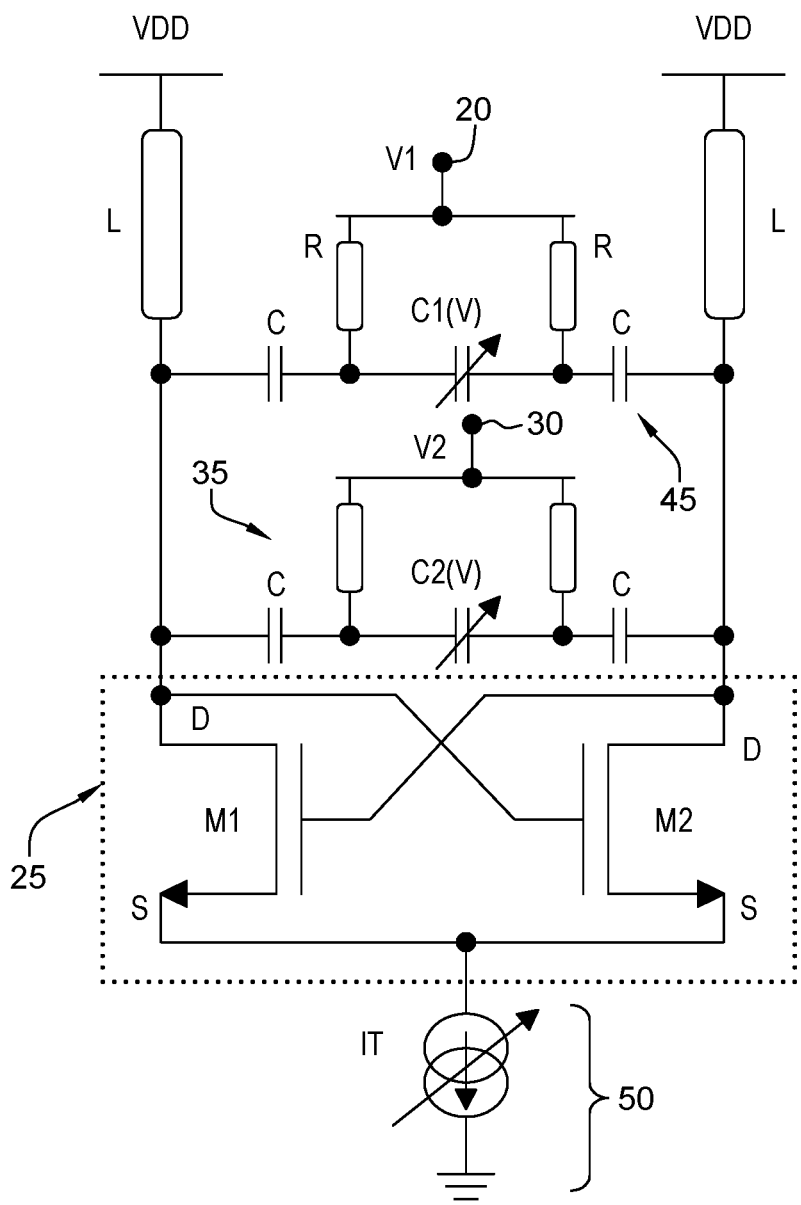
FIG. 1 depicts a circuit diagram of a conventional voltage controlled oscillator circuit (VCO) employing varactors and linearization scheme using capacitively coupled varactors.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

Figure 2:
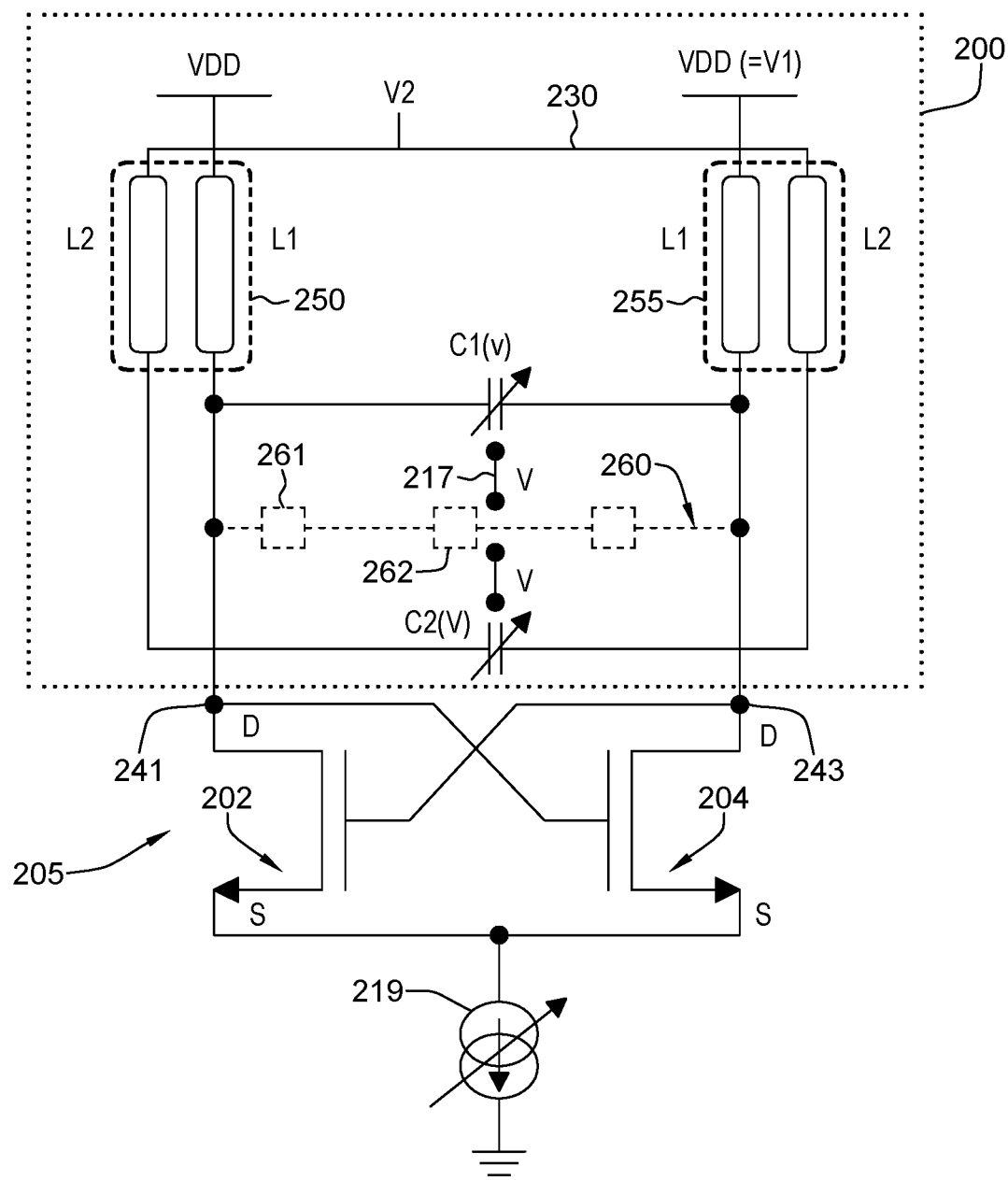
FIG. 2 is a circuit schematic depicting a linearized wide tuning range voltage controlled oscillator employing tank circuit oscillator employing a balun/transformer for varactor biasing according to an embodiment.

FIG. 2 shows one embodiment of a voltage controlled oscillator circuit 100 having a linearized wide tuning range. The oscillator 100 includes a cross-coupled transconductor 205 comprising MOSFETs including an internal pair of MOS transistor 202 and MOS transistor 204 each having a gate, drain and source terminal, where the gates of each 202, (204) device are connected to the drains of the opposite device 204, (202). Cross-coupled transconductor 205 is configured to provide a negative transconductance (i.e., a negative gm) for oscillation. Each MOS FET 202, 204 is designed with critical width and length parameters to regulate the drain current, transconductance, and output drain resistance, and contributes to the output resistance of the circuits.

As shown in FIG. 2, a tank circuit 200 is connected in parallel with cross-coupled transconductor 205. In exemplary and non-limiting embodiments, VCO 100 implements an LC oscillator tank circuit including active parallel connected varactor elements C1(v) and C2(v) for controlling oscillator frequency. Implemented in the LC oscillator are coupled coils L1, L2 of a magnetic transformer or balun elements 250 and 255.

In the exemplary embodiment depicted in FIG. 2, a current source supplied by voltage supply VDD (e.g., providing approximately 1.0 Volts) is connected to one terminal of a first coil L1 of the magnetic balun/transformer 250 and is connected to the same terminal of a first coil L1 of the magnetic balun/transformer 255. In an embodiment, the VDD supply can be applied to an end terminal of a coil, or, the VDD can be applied to the intermediate (e.g., center) tap (or common-mode) connector of each L1 coil. As shown in the VCO of FIG. 2, a second terminal of first coil L1 of magnetic baluns/transformer 250 is connected to the drain terminal 241 of cross-coupled MOS FET 202; likewise, a second terminal of first coil L1 of magnetic baluns/transformer 255 is connected to the drain terminal 243 of cross-coupled MOS FET 204. Voltage supply VDD provides a bias current to cross-coupled MOS FETs 202, 204 through respective coils L1 of respective first and second magnetic balun or transformers 250, 255. A current sink, e.g., a transistor element 219 further connects the source terminals of respective transistors M1, M2 to provide a current sink (tail current) through each transistor.

The integration of baluns 250, 255 with circuit elements shown in FIG. 2 leads to a reduction in power consumption, input/output ports, size and cost of such circuits. Moreover, baluns for such circuit integration, are broadband and compact and have a low insertion loss and good return loss.

In an embodiment, connected across drain the terminals of 241, 243 and likewise, across like first terminals of coils L1 of transformers 250, 255, is a first parallel connected varactor C1(v) used for VCO frequency tuning responsive to an applied voltage, e.g., a charge pump/loop filter voltage "V" or "$V_{CHP}$") and a fixed voltage V1. In embodiments, V1 is a fixed voltage relative to the linearization scheme. This voltage can be generated on-chip, e.g., using a resistive divider or adjustable current onto a resistor (adjustable by a Digital to Analog converter or DAC) and can be derived from voltage VDD via on-chip circuit (not shown). In an embodiment, V1 is equal to VDD, but approximate working values provided on chip may be, e.g., V1=0.75*VDD, V2=0.25*VDD and V~0.5*VDD. The voltages V1 and V2 can be adjusted from the half supply (e.g., 0.5*VDD value) by equal amount in either direction. In one example, V1 and V2 are shifted by 0.5*VDD from V. Hence, the DC voltage across the varactor is (V1-V). In other words, the capacitance vs. voltage characteristics can be shifted with respect to voltage by changing V1. In a further implementation, when bias voltage V1 is equal to VDD, V1 is applied through the center tap of the transformer and similarly for bias voltage V2. For example, if V1 is substantially close to VDD and V2 is substantially close to 0V, both are applied via the center tap of the transformer coils. Further, in an embodiment, charge pump/loop filter voltage "V" may be approximately 0.45 V~0.5 V (approximately half the supply voltage, assuming $V_{DD}$~1.0V). V1 can be set to slightly lower than half of the supply voltage, for example, at 0.35V (for $V_{DD}$~1.0V).

In an embodiment, the voltage across the varactors would be $V_X$–V, where $V_X$ can be VDD,0,V1,V2 and with 0<V1, V2<VDD. Thus, the extreme values that V1 and V2 can take would be VDD and 0 V, respectively. When the varactor is electrically coupled to the drains of the cross-coupled transistors, then the varactor is said to be connected "directly" to the oscillator tank, and when the varactor is magnetically coupled to the drains of the cross-coupled transistors, then it is said to be connected "indirectly", given by the bounded inequality equation for any intermediate value derived from VDD.

In applications such as implementation within a Phase Locked Loop (PLL) load, the VCO 100 output is connected at or across drain terminals 241,243 of the cross-coupled pair MOSFETs which is a differential output.

As further shown in FIG. 2, the second coil L2 of each respective magnetic transformer 250, 255 each includes a first terminal connected together via conductor 230 to which is applied a second voltage from a connection to a further voltage source V2. In an embodiment, the voltage source V2 voltage supply may be slightly higher than half the supply voltage, approximately 0.70V. Connected across second terminals of the respective second coils L2 of each respective magnetic balun/transformer 250, 255 includes a second parallel connected varactor C2(v) used for extending the linear characteristic of the frequency tuning range of the VCO responsive to an applied voltage, e.g., via the charge pump/loop filter voltage V controlled via a control circuit. The second voltage source V2 connected at conductor 230 provides a voltage bias to the second varactor C2(v) element via balun/transformer coil L2. As the V2 voltage supply further provides respective biasing V2 voltage applied to the varactor C2(v), the total tuning voltage applied across varactor C2(v) is V2–V. These V1 and V2 supply voltages are voltage offsets used to linearize the oscillator's frequency vs. tuning voltage characteristics. In embodiments, each varactor may be a PN junction, e.g., reverse biased, a MOS capacitor varactor.

Figure 2A:
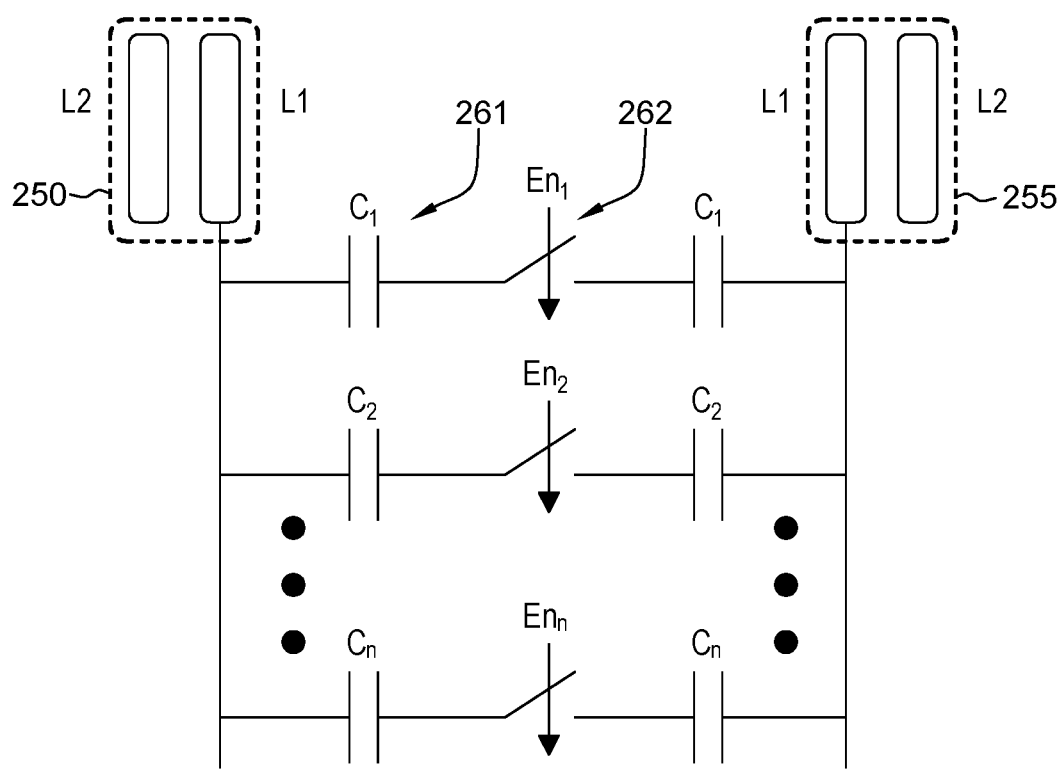
FIG. 2A depicts a digital capacitor array implemented as part of VCO tank oscillator circuit for coarse tuning a VCO center frequency.
Figure 14:
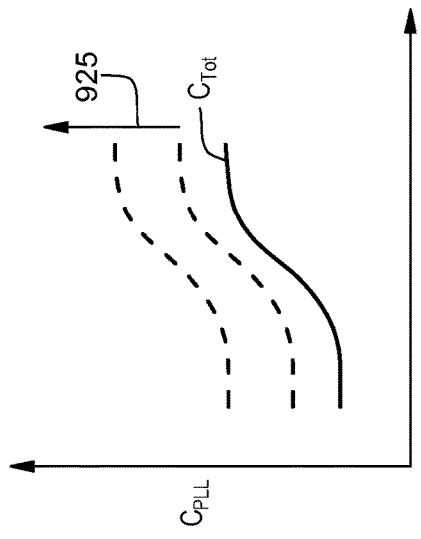
FIG. 14 depicts an exemplary shifting of the total capacitance as function of a digital control word used for coarse tuning the VCO.

In embodiments, each varactor C1(v) and C2(v) providing a voltage dependent capacitance is connected to a separate or same tuning voltage source(s) supplying respective analog bias voltage V using, e.g., a charge pump/loop filter 217. As further shown in FIG. 2, additionally connected in parallel at L1 connections of each balun/transformers 250, 255 and in parallel across first parallel connected varactor C1(v) is a digital capacitor array 260 including one or more parallel connected rows of series connected passive capacitive elements which are digitally controlled by a control circuit to provide a coarse tuning for the oscillator center frequency. As shown in FIG. 2A, connected digital capacitor array 260 includes one or more parallel-connected rows having series connected passive capacitors $C_1$ 261, a parallel connected row of series connected passive capacitors $C_2$, up to a parallel connected row of series connected passive capacitors $C_N$. At each row is a switch element 262 that is digitally controllable, by a digital bit of an applied digital control signal or digital code, e.g., enable bit $E_{n1}$, $E_{n2}, \ldots, E_{Nn}$ to connect one or more particular rows into the array to provide a coarse tuning of the VCO and are at least switchable to compensate for process variation. Thus, when the VCO is incorporated in a phase locked loop (PLL) circuit configuration, for PLL operation, a total PLL capacitance $C_{Tot}$ according to:

$$C_{Tot} = C_{analog} + C_{digital} = C_{VCO}$$

is presented where $C_{digital}$ represents the array 260 of voltage independent (passive) capacitors controllable using switchable digital control words, and $C_{analog}$ is the varactor capacitor $C1(v)$ or $C2(v)$ whose capacitance can be "continuously" changed with respect to an applied voltage, e.g., V1, generated on chip. As shown in FIG. 14, the PLL/VCO frequency is a function of: a digital code word, the programmed distributed varactors (leading to a single equivalent capacitance), and all the inductive elements L1, L2 (leading to a single inductor value) to control a VCO center frequency (f) output.

As shown in FIG. 2A, in alternative embodiments, the digitally controlled capacitor array (e.g., $C_{digital}$) combination 260 is connected in parallel to the analog tunable capacitor array of the tank, and inside each $C_{digital}$ array, individual capacitors may be connected in parallel or series. As shown in FIG. 2A, the $C_{digital}$ array capacitors $C_1, C_2, \ldots, C_n$, are capacitors that are realized using metal-insulator-metal, and switched by digital signals $En_1$, $En_2, \ldots, E_n$, respectively from a controller. The switches can be a transistor, e.g., NMOS FET or PMOS FET or both connected in parallel.

FIG. 14 shows the effect of programming a digital code word for the coarse adjustment of the digitally controlled capacitor array (e.g., $C_{digital}$) combination 260 of the PLL circuit. As shown in FIG. 14, the digital code 925 applied to the $C_{digital}$ capacitor array 260 of the PLL will adjust the $C_{Tot}(=C_{analog}+C_{digital})$, i.e., increase or decrease, and hence the PLL tuning frequency as a function of the programmed digital code word.

In embodiments, the output of the VCO 200 can be single ended using a transformer configuration, where the differential side interfaces with the balanced side of the transformer.

Figure 3A:
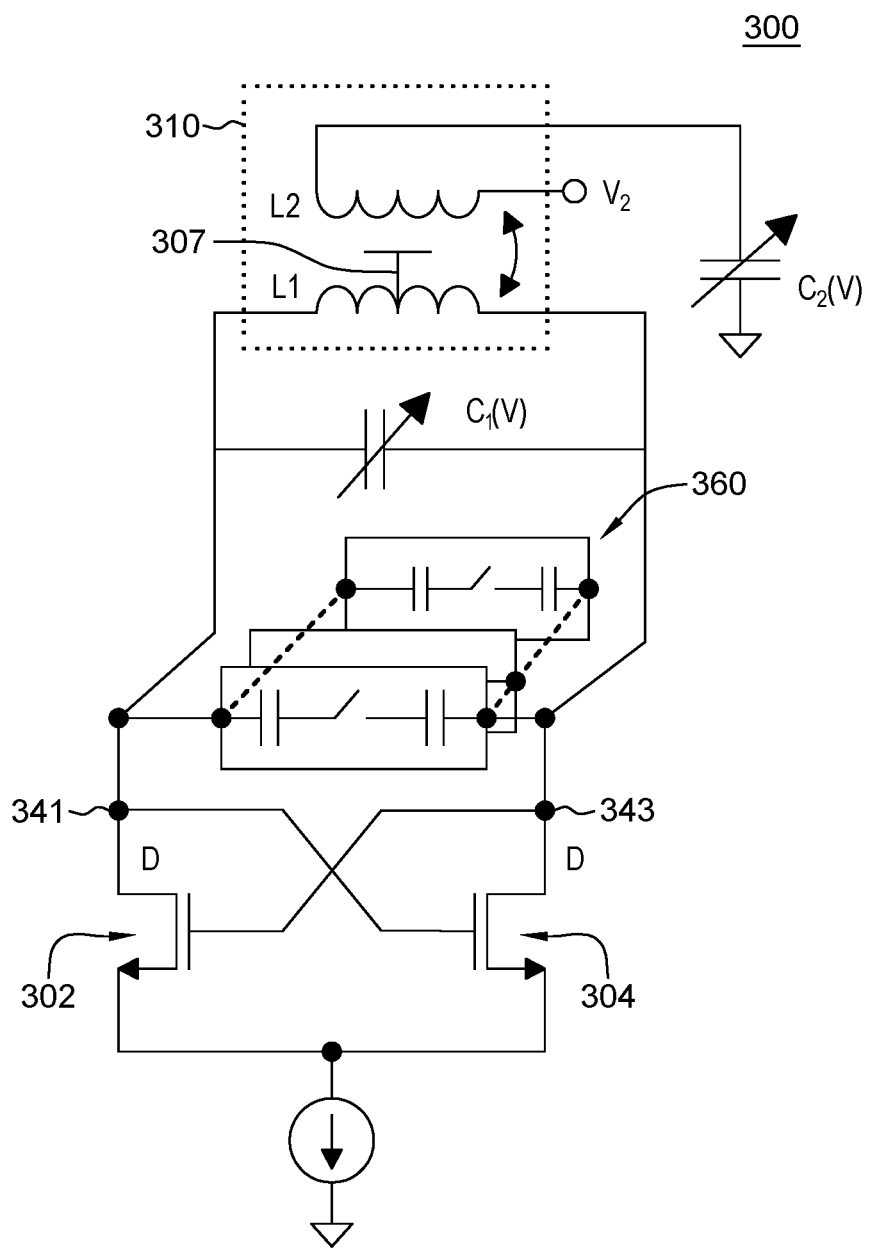
FIGS. 3A-3E shows various alternative configurations implementing a magnetic balun having a single-ended side for providing a linearized wide tuning range VCO circuit.

FIG. 3A depicts a VCO circuit 300 implementing a balun 310 having first and second coils L1, L2 coupled together while L1 is differential and L2 is single ended. As shown in FIG. 3A, a primary coil L1 is the balanced side providing a differential connection in parallel with the terminals of first varactor $C1(v)$, while the coil L2 provides an unbalanced, single-ended connection to the second varactor $C2(v)$. A center tap terminal 307 is associated with the differential terminals and is located at the structural symmetry point. This center tap terminal may be connected to supply/bias/ground potentials. In the embodiment depicted, the VDD supply can be applied to an end terminal of a coil, or, as shown, the VDD can be applied to an intermediate (e.g., center) tap (or common-mode) connector 307 of L1 coil resulting in a net voltage V1 applied at the first varactor $C1(v)$. In an embodiment, second coil L2 includes a first end connected to a second voltage V2 where the V2 voltage is generated on-chip or off-chip, and the second end of coil L2 is connected to the second varactor $C2(v)$ with the other terminal of $C2(v)$ connected to ground. In the embodiment of FIG. 3A, the circuit using the balun is configured to achieve linearization for varactors $C1(v)$, $C2(v)$.

As shown in the VCO of FIG. 3A, connected in parallel across terminals of $C1(v)$ are one or more digitally controlled capacitor array (e.g., $C_{digital}$) combination 360 is connected in parallel to the analog tunable capacitor array of the tank, and inside each $C_{digital}$ array, and one or more arrays of series connected individual capacitors may be switched in for connection in parallel.

As further shown, a first terminal of first coil L1 of magnetic balun 310 is connected to the drain terminal 341 of cross-coupled MOS FET 302; likewise, a second terminal of first coil L1 of magnetic balun 310 is connected to the drain terminal 343 of cross-coupled MOS FET 304. Voltage supply VDD provides a bias current to cross-coupled MOS FETs 302, 304 through coil L1 of respective magnetic balun 310. A current sink, e.g., a transistor element 319 further connects the source terminals of respective transistors 302, 304 to provide a current sink (tail current) through each transistor.

Figure 3B:
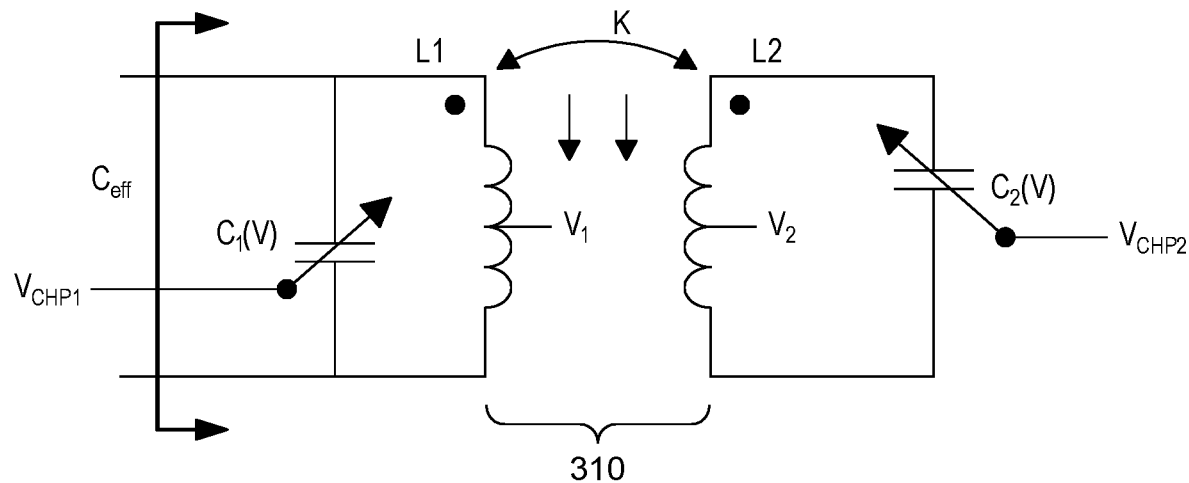
Figure 3C:
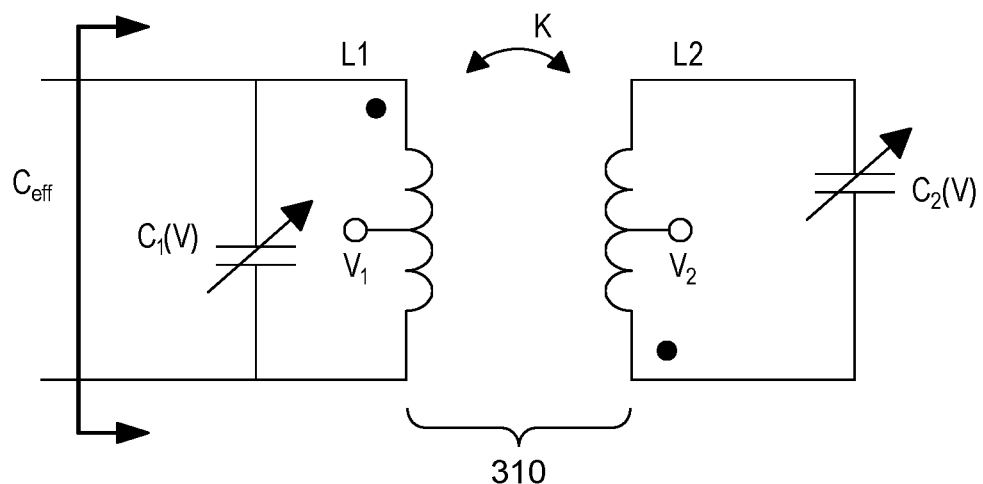

In an embodiment, the coupling of the first and second coils L1, L2 can be positive or negative depending upon the direction of the current flows. For example, as shown in a configuration 325 shown in FIG. 3B, the dots indicate a current flow in the same direction shown by the arrows through respective coils L1, L2 while in a configuration 350 shown in FIG. 3C, the dots indicate a current flow in opposing directions. In both configurations, the V1, V2 voltages are on-chip or off-chip voltages used for biasing the respective varactors $C1(v)$ and $C2(v)$ and are shown provided at the center tap terminals of respective coils L1, L2. FIGS. 3B, 3C, further depict the effective capacitance provided by the configurations using magnetic balun 310. In FIG. 3B, the effective capacitance, Ceff, is equal to $$C_{eff} = C1(v) + \alpha C2(v)$$

where $\alpha$ is the effective turns ratio between coils L1, L2, and "k" is a mutual coupling factor, whereas in FIG. 3C, the effective capacitance, Ceff, is equal to $$C_{eff} = C1(v) - \alpha C2(v)$$

where $\alpha$ depends upon L1, L2 and a mutual coupling factor.

Figure 3D:
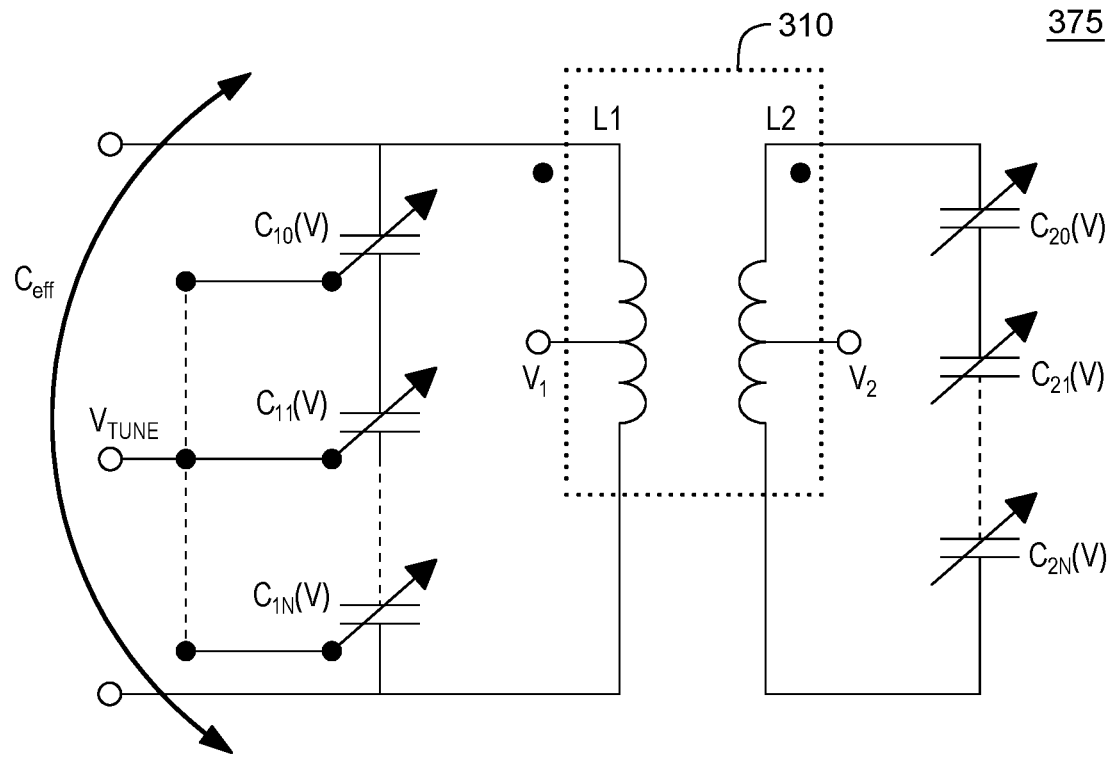
Figure 3E:
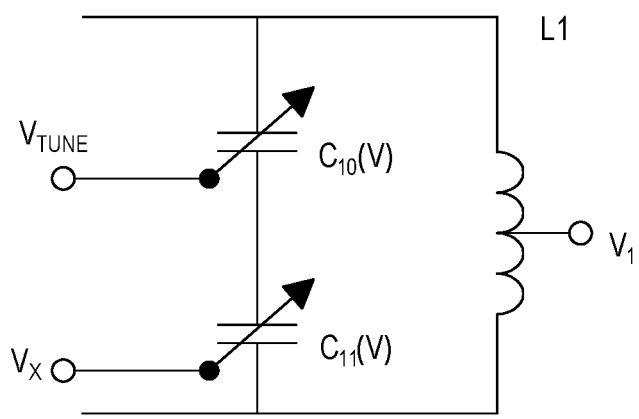

FIG. 3D depicts a further configuration 375 of a portion of the VCO implementing balun 310 providing voltages V1, V2 to bias a plurality varactors that includes a series connection of varactors at each side of the each respective coil L1, L2. Thus, as shown in FIG. 3D, connected across coil L1 receiving V1 voltage is a series connection of varactors $C_{10}(v), C_{11}(v), \ldots, C_{1N}(v)$ and connected across coil L2 receiving voltage V2 is a series connection of varactors $C_{20}(v), C_{21}(v), \ldots, C_{2N}(v)$. In the specific configuration shown in FIG. 3D, a total effective capacitance Ceff is governed according to:

$$\frac{1}{C_{eff}} = \sum_{0}^{N} \frac{1}{c_{1x}(v)} + \frac{1}{\alpha} \sum_{y=0}^{M} \frac{1}{c_{2y}(v)}$$

where N and M are integer numbers. A charge pump voltage, $V_{TUNE}$, is generated on-chip and applied to each of the varactors $C_{10}(v), C_{11}(v), \ldots, C_{1N}(v)$. Each of the varactors $C_{20}(v), C_{21}(v), \ldots, C_{2N}(v)$ further receive a charge pump tuning voltage. While a single charge pump can be used, in embodiments, multiple charge pumps can be used. Each or some of the series connected varactors are connected to the charge pump, however, in an embodiment of a portion of the VCO 380 as shown in FIG. 3E, some of the L1 connected varactors are connected to a static voltage, e.g., on-chip voltage $V_x$ shown connecting varactor $C_{11}(v)$ while tunable charge pump voltage, $V_{TUNE}$, is connected to varactors $C_{10}(v)$.

Figure 4A:
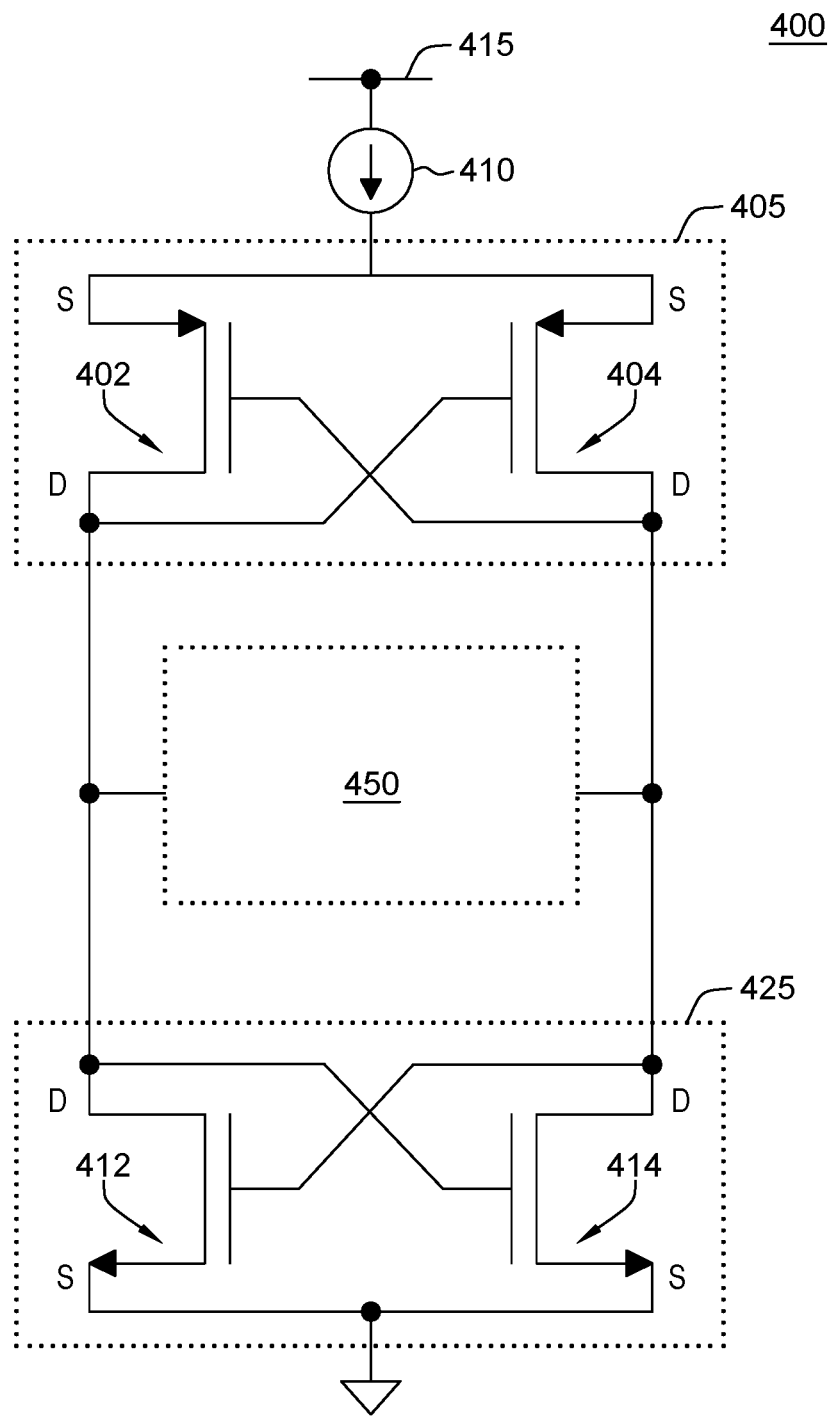
FIG. 4A depicts a first alternative configuration of a linearized wide tuning range VCO circuit employing tank oscillator of FIG. 2 connected to two cross-coupled MOSFET transconductor pairs connected in parallel according to an embodiment.

FIG. 4A shows a first alternative configuration of a linearized wide tuning range VCO circuit 400 employing tank oscillator circuit 450, which may be the oscillator circuit 200 of FIG. 2 or any tank oscillator comprising active and passive components, and which is connected to two cross-coupled MOSFET transconductor pairs in parallel. In FIG. 4A, a first cross-coupled MOSFET transconductor pair 405 includes cross-coupled MOSFETs having respective source terminal connections connected to a constant bias current source 410 including a voltage supply 415 providing a fixed bias current. Further, in the VCO circuit 400 embodiment of FIG. 4A, a second parallel connected cross-coupled MOSFET transconductor pair 425 includes cross-coupled MOSFETs having respective source terminal connections connected to ground. In the VCO circuit 400 depicted in FIG. 4A, while the MOS FETs 402, 404 are shown as P-channel MOS devices, and the MOS FETs 412, 414 are shown as N-channel MOS devices, it is understood that difference combinations of N-channel/P-channel MOS FET devices can be implemented.

Figure 4B:
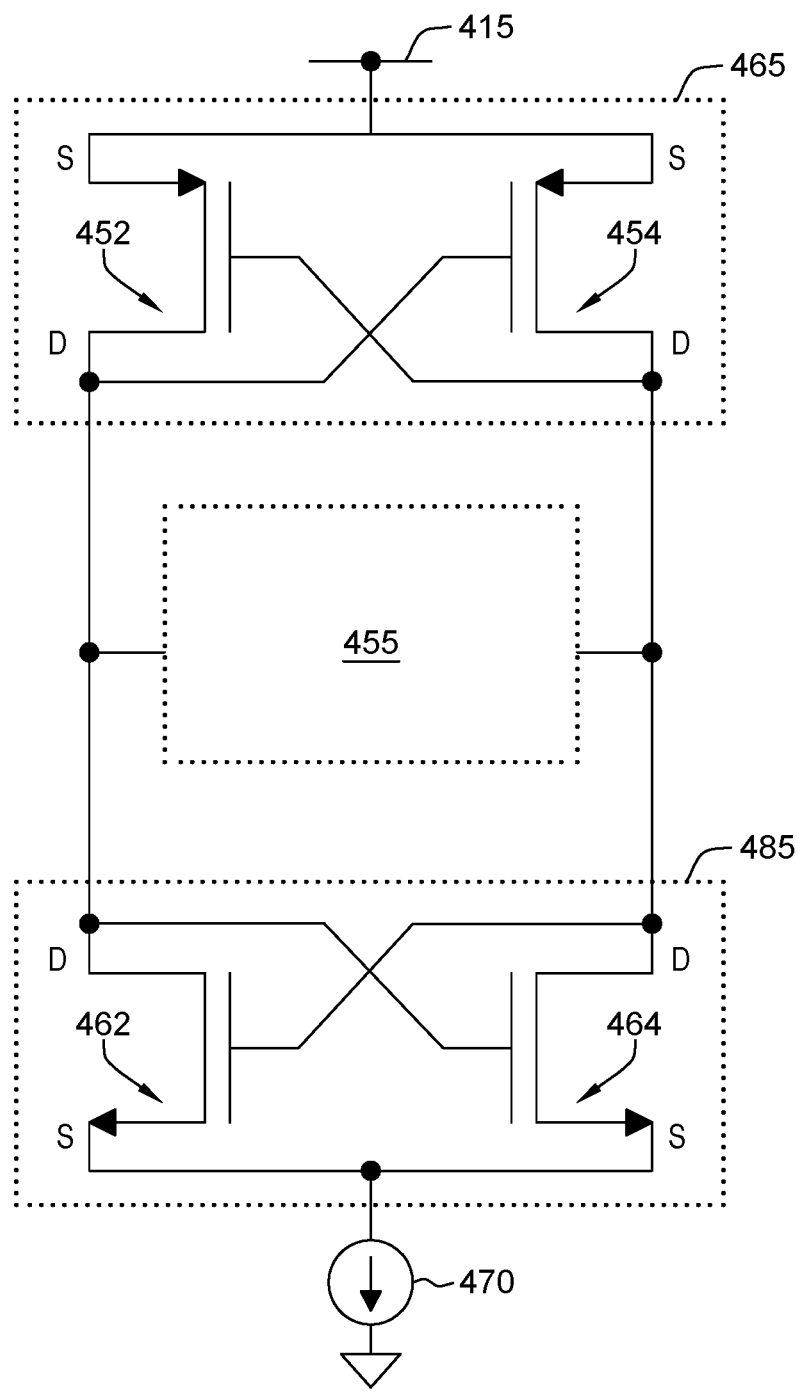
FIG. 4B shows a second alternative configuration of a linearized wide tuning range VCO circuit employing the tank oscillator of FIG. 2 connected to two cross-coupled MOSFET transconductor pairs connected in parallel according to an embodiment.

FIG. 4B shows a second alternative configuration of a linearized wide tuning range VCO circuit 460 employing tank oscillator circuit 455, which may be the oscillator circuit 200 of FIG. 2 or any tank oscillator comprising active and passive components, and which is connected to two cross-coupled MOSFET transconductor pairs in parallel. In FIG. 4B, a first cross-coupled MOSFET transconductor pair 465 includes cross-coupled MOSFETs having respective source terminal connections connected to ground. Further, in the VCO circuit 460 embodiment of FIG. 4B, a second parallel connected cross-coupled MOSFET transconductor pair 485 includes cross-coupled MOSFETs having respective source terminal connections connected to a constant current sink 470 to ground. In the VCO circuit 460 depicted in FIG. 4B, while the MOS FETs 452, 454 are shown as P-channel MOS devices, and the MOS FETs 462, 464 are shown as N-channel MOS devices, it is understood that different combinations of N-channel/P-channel MOS FET devices can be implemented.

Figure 5:
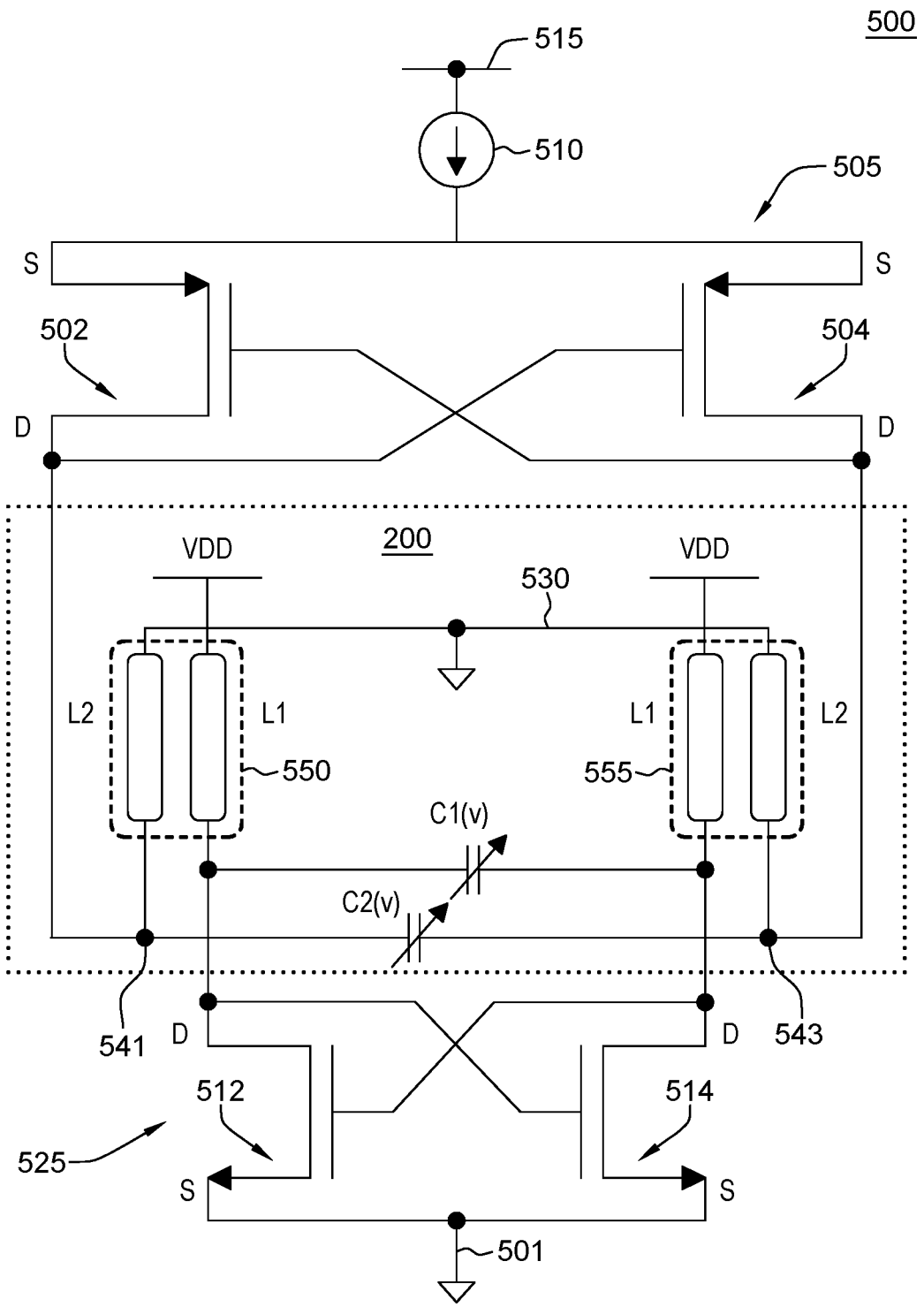
FIG. 5 shows a more detailed circuit schematic of the linearized wide tuning range VCO circuit of FIG. 4A employing the tank oscillator including the magnetic balun/transformers of FIG. 2 according to a further embodiment.
Figure 6:
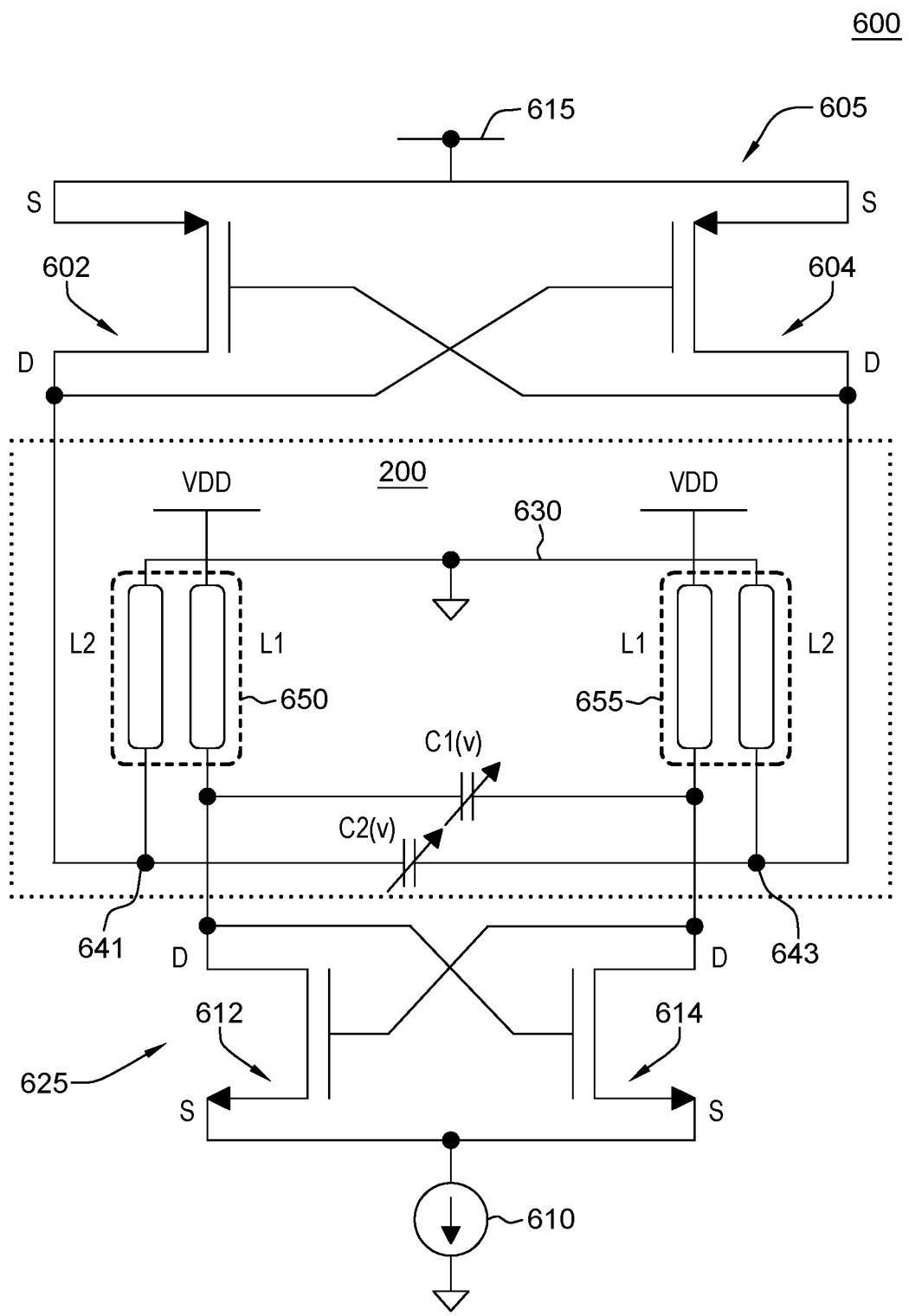
FIG. 6 shows a more detailed circuit schematic of the linearized wide tuning range VCO circuit of FIG. 4B employing the tank oscillator including the magnetic balun/transformers of FIG. 2 according to a further embodiment.

FIGS. 5 and 6 depict further details of the linearized wide tuning range VCO circuit embodiments of FIGS. 3 and 4, wherein a first cross-coupled transconductor (negative gm) coupled to inductor coils L1 of the circuit of FIG. 2, and a second cross-coupled negative transconductor (negative gm) coupled to inductor coils L2, and L1 and L2 are magnetically coupled.

FIG. 5 details a first alternative configuration of a linearized wide tuning range VCO circuit 500 employing tank oscillator circuit 200 of FIG. 2 connected to two cross-coupled MOSFET transconductor pairs 505, 525 in parallel. In FIG. 5, first cross-coupled MOSFET transconductor pair 505 includes cross-coupled MOSFETs 502, 504 having respective source terminal connections (S) connected to a constant bias current source 510 including a voltage supply 515 providing a fixed bias current. Further, in the VCO circuit 500 embodiment of FIG. 5, a second parallel connected cross-coupled MOSFET transconductor pair 525 includes cross-coupled MOSFETs 512, 514 having respective source terminal connections (S) connected to a signal ground 501.

In the VCO circuit 500 of FIG. 5, parallel connected cross-coupled MOSFET transconductor pair MOSFET 512 includes a drain terminal connection (D) to an end of a first coil L1 of a first magnetic balun or transformer 550. Likewise, transconductor pair MOSFET 514 includes a drain terminal connection to an end of a first coil L1 of a second magnetic balun or transformer 555. Each coil L1 of respective magnetic balun/transformers 550, 555 has a second connection to a voltage supply source providing $V_{DD}$ which can provide a bias voltage of approximately 1.0 Volts to the VCO circuit and establishes the necessary quiescent current needed to establish VCO oscillation condition.

In the embodiment of VCO circuit 500, a first parallel connected varactor C1(V) used for VCO frequency tuning as a function of applied voltage (V1) is connected across the drain terminals (D) of cross-coupled MOSFETs 512, 514. The second coil L2 of each respective magnetic balun/transformer 550, 555 include a first terminal connection which is connected together via conductor 530 and is further connected to a signal ground. The second coil L2 of each respective magnetic balun/transformer 550, 555 includes a respective second terminal connection 541, 543 and connected across terminals 541, 543 is a second parallel connected varactor C2(v) used for VCO frequency tuning as a function of an applied voltage V2. In each magnetic balun/transformer 550, 555, L1 and L2 coils are magnetically coupled and provides unique resonance for the entire system. Thus, first cross-coupled MOSFET transconductor pair 505 is magnetically coupled to the second cross-coupled MOSFET transconductor pair 525. The effective turns ratio of a magnetic balun/transformer 550, 555 can be 1:X where X is an integer or a fraction.

Further in the embodiment of VCO circuit 500, MOS FET 502 of parallel connected cross-coupled MOSFET transconductor pair 505 includes a drain terminal connection (D) to the second terminal connection 541 of magnetic balun/transformer 550. Likewise, MOS FET 504 of parallel connected cross-coupled MOSFET transconductor pair 505 includes a drain terminal connection (D) to the second terminal connection 543 of magnetic balun/transformer 555, thereby providing the parallel connection or stack of cross-coupled MOSFET transconductor pairs 505, 525.

In embodiments of the VCO circuits 500 depicted in FIG. 5, the MOS FETs 502, 504 are shown as P-channel MOS devices magnetically coupled to the MOS FETs 512, 514 shown as N-channel MOS devices. It is understood however that different combinations of N-channel/P-channel MOS FET devices can be coupled in the VCO circuits of FIG. 5. For example, the MOS FETs 502, 504 can be N-channel MOS devices and the MOS FETs 512, 514 can also be N-channel MOS devices. Alternatively, the MOS FETs 502, 504 can be N-channel MOS devices and the MOS FETs 512, 514 can be P-channel MOS devices. Alternatively, the MOS FETs 502, 504 can both be N-channel MOS devices and the MOS FET 512 can be a P-channel MOS device and the MOS FET 514 can be an N-channel MOS device. Alternatively, the MOS FETs 502, 504 can be P-channel MOS devices and the MOS FETs 512, 514 can also be P-channel MOS devices. Alternatively, the MOS FETs 502, 504 can both be P-channel MOS devices and the MOS FET 512 can be a P-channel MOS device and the MOS FET 514 can be an N-channel MOS device. Alternatively, the MOS FET 502 can be a P-channel MOS device and the MOS FET 504 can be an N-channel MOS device and the MOS FETs 512, 514 can be N-channel MOS devices. Alternatively, the MOS FET 502 can be a P-channel MOS device and the MOS FET 504 can be an N-channel MOS device and the MOS FETs 512, 514 can both be P-channel MOS devices. Alternatively, the MOS FET 502 can be a P-channel MOS device and the MOS FET 504 can be an N-channel MOS device and the MOS FET 512 can be an N-channel MOS device and the MOS FET 514 can be an P-channel MOS device.

FIG. 6 shows the second alternative configuration of a linearized wide tuning range VCO circuit 600 employing tank oscillator circuit 200 of FIG. 2 connected to two cross-coupled MOSFET transconductor pairs 605, 625 in parallel. In FIG. 6, first cross-coupled MOSFET transconductor pair 605 includes cross-coupled MOSFETs 602, 604 having respective source terminal connections (S) connected to a voltage supply source 615 for providing a current to the circuit 600. Further, in the VCO circuit 600 embodiment of FIG. 6, a second parallel connected cross-coupled MOSFET transconductor pair 625 includes cross-coupled MOSFETs 612, 614 having respective source terminal connections (S) connected through a bias current sink 610 to a signal ground.

In the VCO circuit 600 of FIG. 6, parallel connected cross-coupled MOSFET transconductor pair MOSFET 612 includes a drain terminal connection (D) to an end of a first coil L1 of a first magnetic balun or transformer 650. Likewise, transconductor pair MOSFET 614 includes a drain terminal connection to an end of a first coil L1 of a second magnetic balun or transformer 655. Each coil L1 of respective magnetic balun/transformers 650, 655 has a second connection to a voltage supply source providing $V_{DD}$ which can be approximately 1.0 Volts to the VCO circuit and establishes the necessary quiescent current needed to establish VCO oscillation condition.

In the embodiment of VCO circuit 600, a first parallel connected varactor C1(V) used for VCO frequency tuning as a function of applied charge pump/loop filter voltage (V) is connected across the drain terminals (D) of cross-coupled MOSFETs 612, 614. The second coil L2 of each respective magnetic balun/transformer 650, 655 include a first terminal connection which are connected together via conductor 630 and is short circuited to a signal ground. The second coil L2 of each respective magnetic balun/transformer 650, 655 includes a respective second terminal connection 641, 643 and connected across these terminals is a second parallel connected varactor C2(v) used for VCO frequency tuning as a function of an applied voltage V2. In each magnetic balun/transformer 650, 655, L1 and L2 coils are magnetically coupled when quiescent current flows through each, and provide condition of oscillation. Thus, first cross-coupled MOSFET transconductor pair 605 is magnetically coupled to the second cross-coupled MOSFET transconductor pair 625. The turns ratio of a magnetic balun/transformer 650, 655 windings can be 1:X where X is an integer or fraction.

Further in the embodiment of VCO circuit 600, MOS FET 602 of parallel connected cross-coupled MOSFET transconductor pair 605 includes a drain terminal connection (D) to the second terminal connection 641 of magnetic balun/transformer 650. Likewise, MOS FET 604 of parallel connected cross-coupled MOSFET transconductor pair 605 includes a drain terminal connection (D) to the second terminal connection 643 of magnetic balun/transformer 655, thereby providing the parallel connection or stack of cross-coupled MOSFET transconductor pairs 605, 625.

In embodiments of the VCO circuits 600 depicted in FIG. 6, the MOS FETs 602, 604 are shown as P-channel MOS devices magnetically coupled to the MOS FETs 612, 614 shown as N-channel MOS devices. It is understood however that different combinations of N-channel/P-channel MOS FET devices can be coupled in the VCO circuits of FIG. 6. For example, the MOS FETs 602, 604 can be N-channel MOS devices and the MOS FETs 612, 614 can also be N-channel MOS devices. Alternatively, the MOS FETs 602, 604 can be N-channel MOS devices and the MOS FETs 612, 614 can be P-channel MOS devices. Alternatively, the MOS FETs 602, 604 can both be N-channel MOS devices and the MOS FET 612 can be a P-channel MOS device and the MOS FET 614 can be an N-channel MOS device. Alternatively, the MOS FETs 602, 604 can be P-channel MOS devices and the MOS FETs 612, 614 can also be P-channel MOS devices. Alternatively, the MOS FETs 602, 604 can both be P-channel MOS devices and the MOS FET 612 can be a P-channel MOS device and the MOS FET 614 can be an N-channel MOS device. Alternatively, the MOS FET 602 can be a P-channel MOS device and the MOS FET 604 can be an N-channel MOS device and the MOS FETs 612, 614 can be N-channel MOS devices. Alternatively, the MOS FET 602 can be a P-channel MOS device and the MOS FET 604 can be an N-channel MOS device and the MOS FETs 612, 614 can both be P-channel MOS devices. Alternatively, the MOS FET 602 can be a P-channel MOS device and the MOS FET 604 can be an N-channel MOS device and the MOS FET 612 can be an N-channel MOS device and the MOS FET 614 can be a P-channel MOS device.

The embodiments of the oscillator circuits and methods herein achieve linearized tuning over a wider range of tuning frequencies by implementing a magnetic balun/transformer for biasing varactor elements. In operation, to tune an output oscillation frequency of the tank circuit, charge pumps/loop filter 217 are controlled to provide respective bias voltages V1 and V2 to respective varactors C1(v), C2(v) to control their respective capacitance values.

Figure 9:
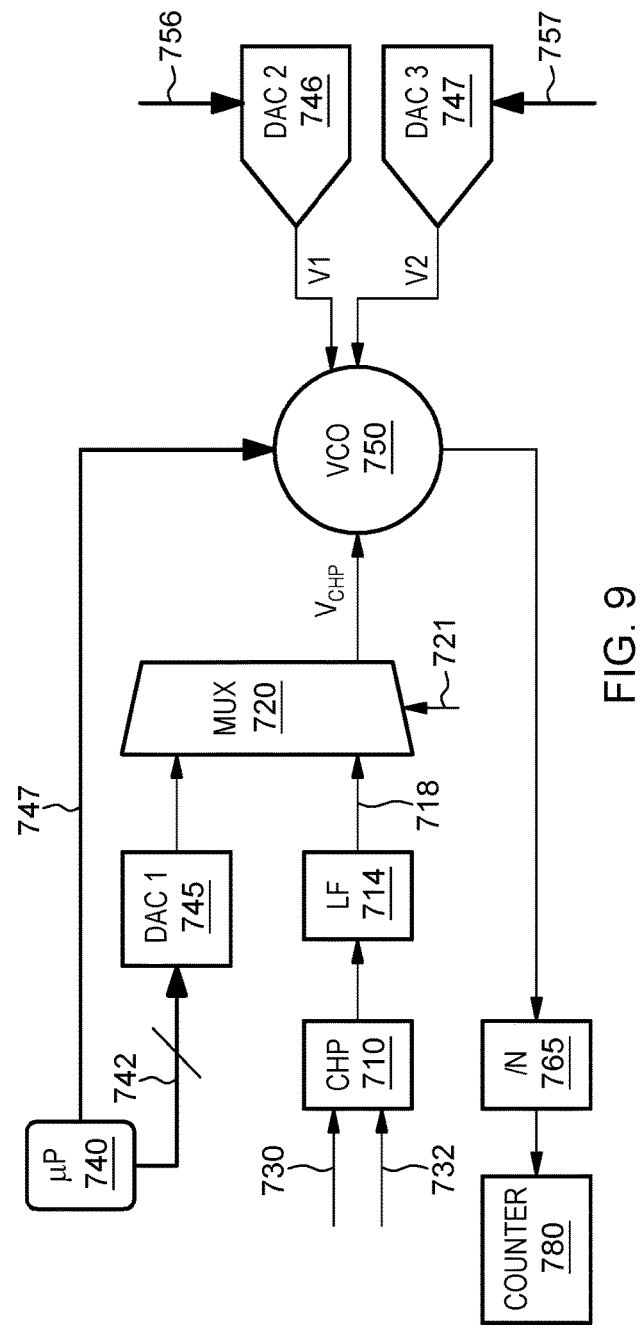
FIG. 9 shows a detailed calibration system 850 for the bias voltages V1, V2 generated for biasing the varactors using the magnetic balun/transformer in the embodiments herein.

FIG. 9 shows a diagram 900 depicting the increase in and extension of the linear tuning range 910 of the VCO using the magnetic balun/transformer to bias varactors in the embodiments described herein. In particular, this varactor biasing configuration provides for a lower parasitic capacitance coupling structure leading to wide tuning range having extended linearization. Given (Q) as the loaded quality factor of the tank resonator that is typically obtained as the parallel combination of the unloaded quality factors of inductive and capacitive elements, the circuits of FIGS. 2-6 exhibit no loss in Q factor (Q) for the oscillator due to providing the bias voltage at the common mode points of the inductive elements which does not affect the differential mode of operation.

Figure 13:
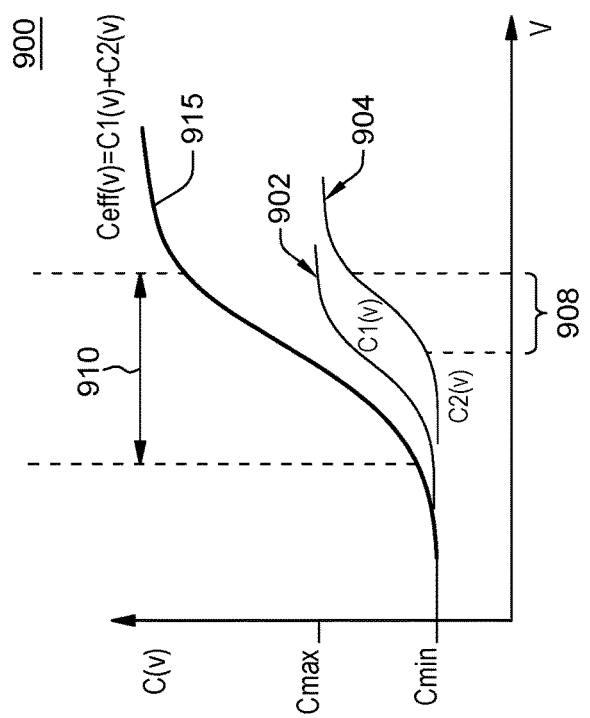
FIG. 13 shows a diagram 900 depicting the increase in and extension of the linear tuning range 910 of the VCO using the magnetic balun/transformer to bias varactors in the embodiments described herein.

FIG. 13 shows the extended linearization 915 of the effective capacitance range of the individual varactors, e.g., a tunable capacitance range 902 of varactor C1(v) and tunable capacitance range 904 of varactor C2(v) as between a lower capacitance value $C_{min}$ and upper capacitance value $C_{max}$. The linear portion of the capacitance range of a varactor, e.g., varactor C2(v), is shown as range 908.

In the VCO embodiments described herein, by providing fixed offset voltage (shifting the C(V) curve for varactor to the left or right), and depending on the effective coupling ratio between the coil elements (e.g. effectively scaling the capacitances), the C1(v) curve 902 and C2(v) curve 904 can be scaled and shifted relative to each other by applying a fixed bias voltage applied through the balun coil. The non-linear C1(v) curve (and/or C2(v) curve) are separated and can be shifted positive or negative (shifted to left or right) by respective bias voltages (V1 and V2) through the balun. When summed, these separated, shifted, scaled individual responses of reduced range form the extended linear response 910, so the capacitors are added together to obtain a single resonance point. Due to the coupled nature of the transformers, the entire structure provides an effective value of inductance and capacitances. For example, when two inductors are coupled together, with effective turns ratios 1:X, then the effective capacitance across the first coil becomes Ceff,1=$C_1+X^2*C_2$ where C1 and C2 are capacitances connected across the first and second coils respectively. Similarly, two coils with inductances L1 and L2, with mutual inductance of M represents an effective inductance of Leff,1=L1+M*L2. Hence, the resonance frequency computed from the effective inductance and capacitance connected across the first coil becomes Leff,1 and Ceff,1, leading to a center frequency of f=1/(2*pi*sqrt(Leff,1*Ceff,1)). The same frequency can be obtained if the representation is made with respect to the second coil, e.g. f=1/(2*pi*sqrt(Leff,1*Ceff,1))=1/(2*pi*sqrt(Leff,2*Ceff,2)). Hence, the entire distributed structure provides a single resonance frequency. Thus, as illustrated as follows, a closed form equation to describe a varactor capacitance is given as follows:

$$C(v) = \frac{C\max - C\min}{2}\tanh\left(a + \frac{v}{v_0}\right) + \frac{C\max + C\min}{2}$$

where a is a fitting parameter that defines the intercepts of the C(V) curve at zero bias voltage and $v_0$ is the predetermined offset voltage. However, according to embodiments herein, providing "n" multiple varactors connected in parallel (or series) combination with respect to a predetermined offset, the effective overall capacitance is substantially linear, i.e., $$C(V)_{Total\ parallel} = C(V-V_1) + C(V-V_2) + \ldots + C(V-V_n)$$

or alternatively, $$C(v)_{Total_{series}} = \frac{1}{\frac{1}{C(V-V_1')} + \frac{1}{C(V-V_2')} + \ldots, \frac{1}{C(V-V_n')}}$$

where V is the charge-pump/loop filter voltage applied to the respective varactors, and $V_1$, $V_2$, etc. are specific analog voltages applied to the respective varactors with the specific linearization desired. In an embodiment, these voltages are generated on-chip and can be provided to the resonator tank by capacitive or inductive coupling. An effective capacitance looking into a passive resonator becomes:

$$C_{eff}(v) = \alpha_1 C_1(v) + \alpha_2 C_2(v) \ldots + \alpha_n C_n(v)$$

where $\alpha_1, \alpha_2, \ldots \alpha_N$ etc. are dependent upon the turns ratio between the L1 and L2, ..., Ln coils of the balun and coupling coefficients between coils. In a special case, when α1=α2=1, Ceff(v)=C1(v)+C2(v) which occurs depending on the ratio factors 1:X1:X2, α1,α2 can be desired fractions for scaling and adding these capacitors.

FIG. 7 depicts a high-level phase lock loop circuit 700 in which the voltage controlled oscillator 750 of an embodiment described herein is employed. In particular, a phase locked loop (PLL) includes an input receiving an oscillator signal at a reference frequency which is input through a first frequency divider circuit 705 to divide down the frequency by a value "/P" 705. In the PLL circuit of FIG. 7, there are several dividers denoted as "/P" 705 "/N" 765 and "/K" 770 which are used to generate the frequency of operation. In the specific arrangement of PLL 700, the output frequency $f_{out}$ is given as:

$$f_{out} = \left(\frac{f_{ref}}{P}\right) \times N \times \left(\frac{1}{K}\right)$$

where P, N, K are integer numbers. This divided down reference frequency signal 703 is then input to the phase frequency detector 708 (PFD) which receives a PLL output feedback signal 775 and provides two output signals 730, 732 characterizing the state of the loop, i.e., whether a specific operating frequency has been achieved. The PFD phase frequency difference signals 730, 732 are input to the charge pumps to generate a signal that is filtered by loop filter element 714 (LF) to remove any ripple. In an embodiment, the loop filter output signal is input to a multiplexer 720 which is configured to forward the LF output signal directly as input for tuning a varactor element (e.g., C1(v) or C2(v)) of VCO 750. The output signal 760 of the VCO 750 is feedback to the PFD 708 through a further feedback divider 765 shown by the block "IN" in FIG. 7 which determines the "divide by" output. It is noted that VCO output signal 760 can be further divided by divider element 770 which further divides the oscillator frequency by the factor "/K". In an embodiment, the multiplexor 720 responds to control signal 721 to select the CHP/LF path when configured for steady state operation, or select the output from DAC 745 when in a calibration mode.

In operation, the PFD 708 compares the phase difference of the two signals, reference signal and the VCO signal (VCO divided by integer number) and generates signal 730 which can be an "UP" signal or signal 732 which can be a "DOWN" signal. The signals 730, 732 are generally pulses, and the difference in their time duration (UP-DOWN) indicates the amount of adjustment needed in the control voltage (provided by the charge pump/loop filter) in order to obtain the desired frequency from the VCO.

FIGS. 7A-7C depict various PLL states of the VCO 700 of FIG. 7 and the relation between UP and DOWN pulse signals detected by a phase frequency detector used when tuning the VCO center frequency in steady state operation. For example, as shown in FIG. 7A, the UP signal (pulse width) is greater than the DOWN signal (pulse width); in FIG. 7B, the UP signal (pulse width) is less than the DOWN signal (pulse width); and in FIG. 7C, the UP signal (pulse width) is equal to the DOWN signal (pulse width). In response to the UP/DOWN pulses, the charge pump sources or sinks current, and generates a corresponding voltage 718 at the LP output. This loop filter filters the ripple on the charge pump output, and provides a constant analog voltage, e.g., voltage V, which changes the capacitance of the voltage variable capacitor (varactor C1(v) or C2(v)) as described through a balun coil. At the steady state (PLL locked), then UP=DOWN, meaning that no current from the charge pump should flow to the loop filter. In each of the embodiments herein, the charge pump tuning voltage V applied to the varactor, with the varactor extending the linear tuning range of the VCO.

In FIG. 7, while there is depicted single ended output from VCO 750, in other implementations, the VCO outputs are differential. In all the VCO embodiments depicted, the outputs are taken from the drain side of the transistors of the cross-coupled transconductor. For example, for the inductors L1 and L2 shown in FIGS. 5, 6 center tap terminal of one side is connected to the supply/GND respectively, while the "other side" is connected to the drain of the respective transistors. It is this drain terminal from where the output is taken. For the magnetic coupled system shown, the output can be taken from either the drains of the NMOS transistors or the drains of the PMOS transistors.

In view of FIG. 7, with respect to tuning of the frequency of the VCO 750 of PLL 700, the digital capacitor array 260 in FIGS. 2, 2A can receive digital code 747 to set the coarse tuning using an on-chip or off-chip processor element. Then a fine center frequency tuning using the charge pump/loop filter voltages can be automatically controlled using PLL 700 by measuring the VCO gain (slope of the frequency vs analog tuning voltage characteristics).

In embodiments having multiple varactors, multiple charge pump/PFD/loop filter combinations are used and connected to the varactors. The multiple PFDs can operate from multiple phases of a reference clock. Due to the large area of analog components, such loop filters are implemented digitally to save area.

Figure 8:
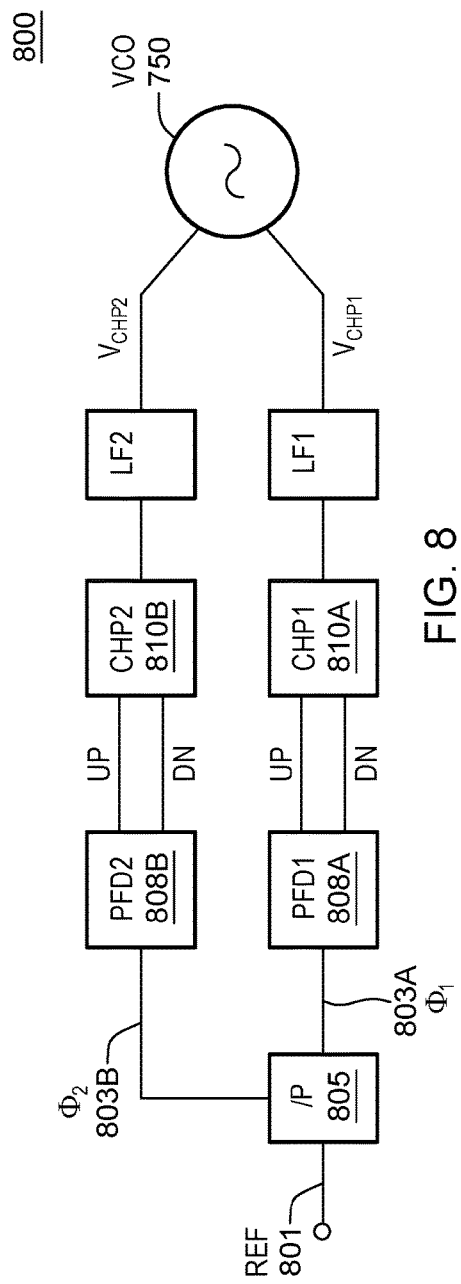
FIG. 8 shows a modified charge pump circuit configuration 800 corresponding to the PLL circuit of FIG. 7 and having multiple charge pumps that provide additional linearization for the voltage controlled oscillator of the present embodiments.

FIG. 8 shows a modified charge pump circuit configuration 800 corresponding to the PLL circuit of FIG. 7 and having multiple charge pumps that provide additional linearization for the voltage controlled oscillator 750. In FIG. 8, a frequency divider circuit 805 divides down an input clock signal 801 at a reference frequency by a value "/P". In the PLL circuit of FIG. 8, output of the frequency divider circuit 805 provides two (or more) phase signals: a first signal 803A at a frequency/phase $\phi 1$ for processing along a first path and a second signal 803B at a frequency/phase $\phi 2$ for processing along a second path. Along the first path, signal 803A is input to PFD circuit 808A, and along the second path, signal 803B is input to PFD circuit 808B. Each respective PFD 808A, 808B generates respective UP and DOWN pulse signals as detected by the phase frequency detector (feedbacks path not shown) for use when tuning the VCO center frequency in steady state operation.

At each path, the each respective difference in time duration of the UP DOWN signals indicates the amount of adjustment needed in the control voltage provided by a respective charge pump/loop filter) in order to obtain the desired frequency from the VCO. For example, along first path, the UP and DOWN signals are input to a first charge pump 810A and along the second path, the UP and DOWN signals are input to a second charge pump 810B. Respective loop filters 814A, 814B receive respective charge pump outputs that generate the VCHP1, VCHP2 voltages used to control respective first and second varactors C1(V) and C2(v) such as shown in FIG. 3B.

The PLL scheme in FIG. 8 can be extended to N phases for further linearization.

In particular, in FIG. 7, processor element 740 running program code activates the open loop VCO (not the PLL), and the output frequency is measured. The feedback divider, e.g., embodied as divider block 765 in FIG. 7) determines the divide by output. This frequency represents the frequency of the VCO including the digital code, distributed varactor and all the inductive elements which leads to a VCO center frequency (f) output given as:

$$f = \frac{1}{2\pi\sqrt{LC}}.$$

In an embodiment, the fixed voltages, e.g., bias voltages V1 and V2 used for linearization are calibrated prior to operation of the VCO and PLL of (FIGS. 7 and 8) by measuring the frequency versus code characteristic for the VCO. FIG. 9 shows a detailed calibration system 850 for the bias voltages V1, V2 generated for biasing the varactors using the magnetic balun/transformer in the embodiments herein. As shown in FIG. 9, in the main mode of operation, the multiplexor control signal 721 selects the path CHP/LF in steady state operation; however, it selects the output from the DAC 745 (e.g., DAC 1) when in a calibration phase. In FIG. 9, the measurement of the resulting VCO output signal frequency is obtained by a counter device 780. In an embodiment, the divide by "IN" factor can be programmed to work as a counter, or the output of the (frequency divider)/N block 765 is provided as the input to the counter. The output of the counter 780 is a digital code which represent the current VCO frequency which is computed according to:

VCO Frequency=(CNTR output)×$N$×(CNTR clock frequency)

In the calibration scheme, digital to analog converters (DAC 2) 746 and (DAC 3) 747 each receive the digital code 756, 757 to provide a coarse adjustment for the fixed V1 and V2 varactor bias voltages. In an embodiment, only V1 may used or both V1, V2 can be used. Frequency is measured as the tuning voltages are changed and linearity is defined as the same counter output difference (movement) for a given delta in the code for the DAC. The offset DACs 746 and 747 may also use substantially lower resolution compared to the frequency calibration DAC 745 in order to save area.

Figure 10:
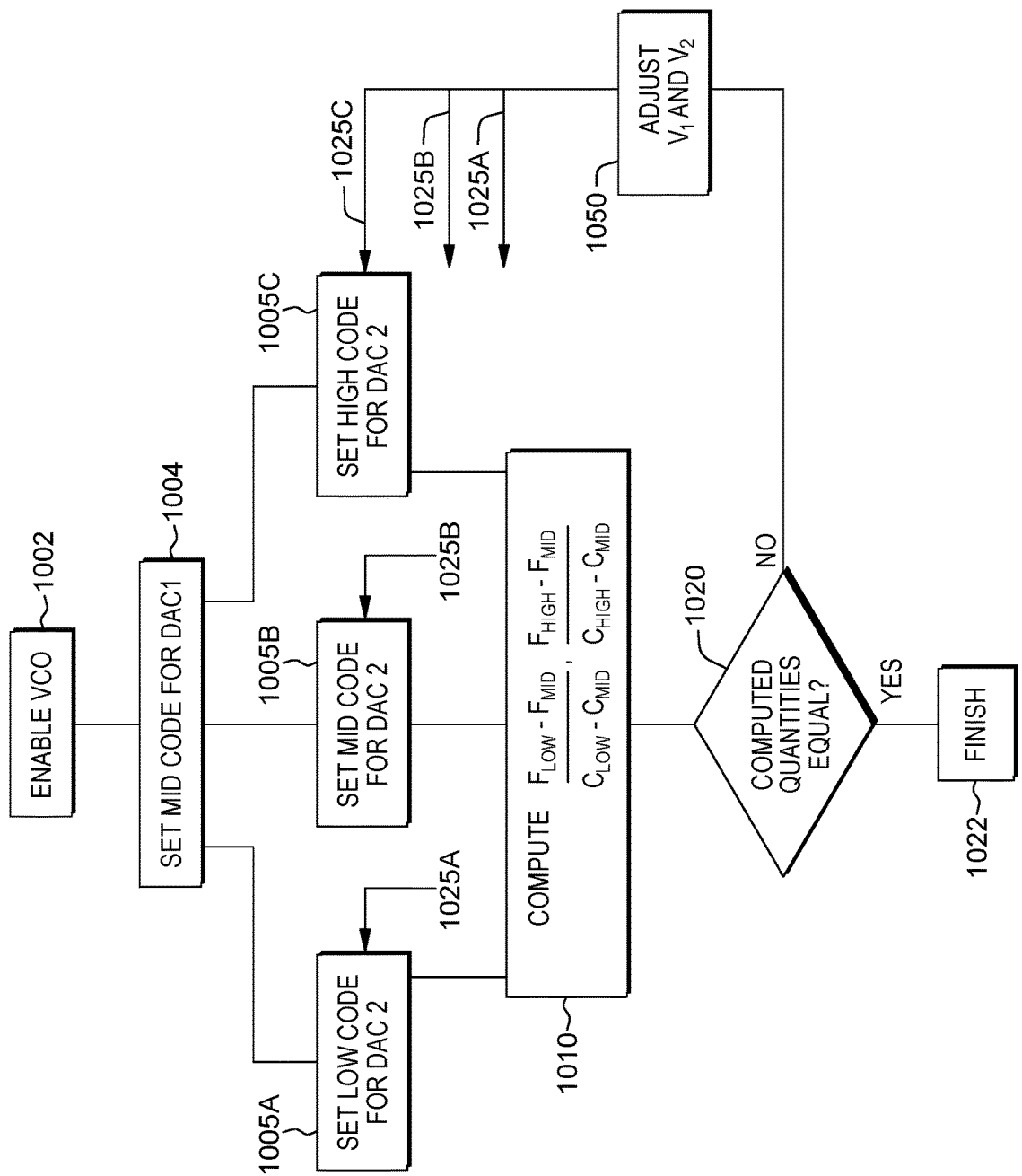
FIG. 10 depicts a method for calibrating the VCO circuit of FIGS. 7-9.

FIG. 10 depicts a method 1000 for calibrating the VCO circuit of FIGS. 7-9. A first step 1002 initializes operation of the VCO 750 shown in FIGS. 7 and 9. Initially, at 1004, for calibration, controller element, e.g., a microprocessor 740, sets the middle value for analog voltage, e.g., to set the tuning voltage code for DAC 1 745 at the midpoint to provide a coarse tuning of the VCO 750. In an embodiment, upon starting from the mid code setting, there are performed either of two operations: 1) keeping V1 the same, vary V2, both operations through digital codes; or 2) keeping V1 and V2 at the mid values, and then change V1 and V2 by the same delta in opposite directions.

For example, for calibration, the DAC 1 is activated, and a mid code is applied which may be a 6-bit binary code to provide for a coarse capacitor tuning voltage, e.g., a value 6'b100000. A finer 64 bit code word with most significant bit (MSB)=1 and all other low significant bits (LSB)=0 can be used as a midpoint voltage for calibration. As shown in FIG. 9, DAC 1 745 receives the code to provide this voltage which voltage is multiplexed with the output 718 from charge pump/LF 714. V1 and V2 values are adjusted in order to achieve an overall linear C(V) characteristics to ensure wide continuous tuning range for the VCO. With respect to processing of DAC 2 746 used to program bias voltage V1, a respective low code is set for DAC2 at step 1005A, a respective middle (mid) code is set for DAC2 at step 1005B and a respective high code is set for DAC2 at step 1005C. Continuing to step 1010, FIG. 10 various measurements are performed including obtaining a VCO frequency measurement based on the as the V1 or both V1 and V2 tuning voltages are changed. Linearity is achieved as the same counter output difference (movement) for a given delta in the code ("C") for the DAC.

Thus, a first quantity, VCO gain, or frequency per code is the computed as:

$$\frac{F_{LOW} - F_{MID}}{C_{LOW} - C_{MID}}$$

where $F_{LOW}$ is a VCO frequency obtained at the counter 780 output and is computed based on the "low" code setting for the DAC 746 and $F_{MID}$ is the VCO frequency computation computed based on the "mid" code setting for the DAC 746. Similarly, a varactor voltage code $C_{LOW}$ for capacitance of the varactor is computed based on the "low" code setting for the DAC 746 and a varactor voltage code $C_{MID}$ is computed based on the "mid" code setting for the DAC 746. A second quantity is computed according to:

$$\frac{F_{HIGH} - F_{MID}}{C_{HIGH} - C_{MID}}$$

which provides the VCO gain, where $F_{HIGH}$ is a VCO frequency obtained at the counter 780 output and is computed based on the "high" code setting for the DAC 746 and $F_{MID}$ is the VCO frequency computation computed based on the "mid" code setting for the DAC 746. Similarly, a varactor code $C_{HIGH}$ for capacitance of the varactor is computed based on the "high" code setting for the DAC 746 and a varactor code setting $C_{MID}$ is computed based on the "mid" code setting for the DAC 746.

Continuing at 1020, the equivalency of these two quantities are determined. In particular, when the two VCO gain quantities are determined equal, i.e., $$\frac{F_{LOW} - F_{MID}}{C_{LOW} - C_{MID}} = \frac{F_{HIGH} - F_{MID}}{C_{HIGH} - C_{MID}}$$

then the V1 voltage is fixed and the VCO deemed calibrated and the process ends at 1022. Otherwise, at 1020, if it is determined that these two quantities are not equal, the process returns to 1050 to either adjust the V1 (and V2) voltages. In particular, as shown in FIG. 10, keeping the mid code for DAC 1 set, feedback signals 1025A, 1025B, 1025C are generated at 1050 and provided to modify one or more respective low code setting for DAC2 at step 1005A, a middle code setting for DAC2 at step 1005B, and a respective high code setting for DAC2 at step 1005C.

Figure 11:
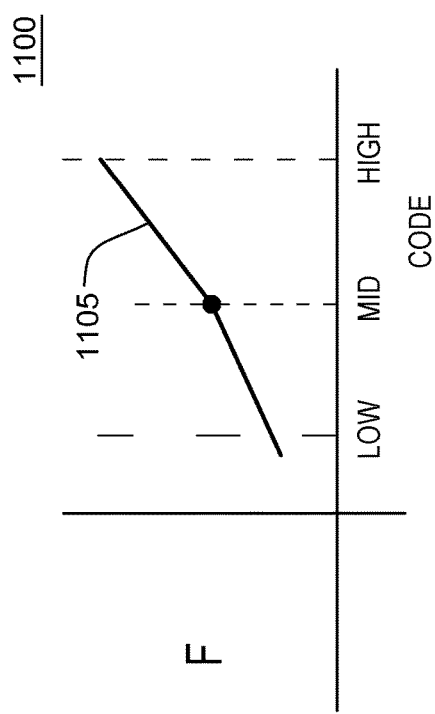
FIG. 11 depicts a plot of the relation between the codes used for calibrating the VCO as a function of frequency.

FIG. 11 depicts a plot 1100 of the relation between the codes used for calibrating the VCO as a function of frequency. In particular, there is shown the mapping 1105 of the code settings used to program the DACs for voltages V1, V2 and the corresponding VCO frequency response, e.g., corresponding low frequency, mid frequency and high frequency values.

Figure 12:
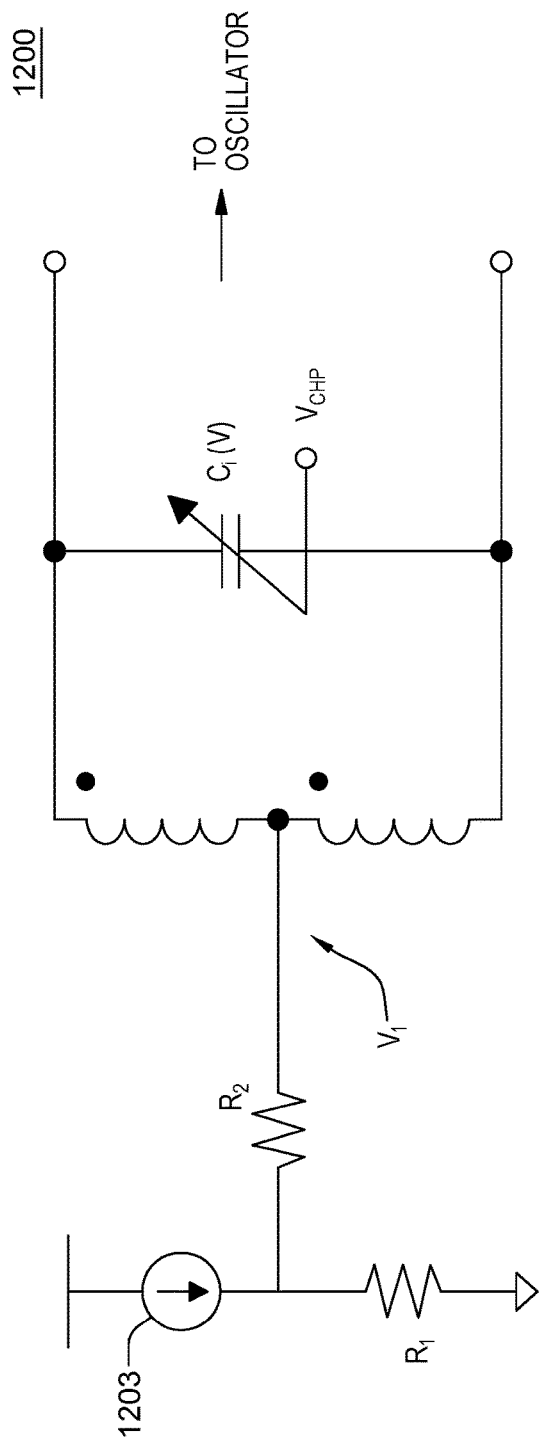
FIG. 12 depicts a circuit diagram used in the generation of the V1 bias voltage applied to the varactor C1(V) in the VCO circuits of FIGS. 2-6.

FIG. 12 depicts a circuit diagram 1200 used in the generation of the V1 bias voltage applied to the varactor C1(V) in the VCO circuits of FIGS. 2-6. In particular, voltage V1 (and similarly V2) is generated on-chip by providing a resistor divider where DC current 1203 flows into a resistor R1 and also flows to another resistor R2. As the resistors R1 and R2 are used in common mode configuration, they do not influence the differential performance of the oscillator.

The VCO circuit embodiments of FIGS. 2-8 may be realized on circuit boards, e.g., as surface mount components and circuits on a printed circuit boards, or realized as semiconductor components in semiconductor circuits (chips) or integrated circuits (ICs). When implemented in an integrated circuit, the magnetic balun/transformer can be laterally coupled to the circuit, or can be vertically coupled. In further embodiments, the magnetic balun/transformer can use a combination of layers in magnetic material and semiconductor back-end-of-line stack. Thus, in an embodiment implementing three inductors L1, L2 and a third coil L3, magnetic coupling between the two coils is achieved by lateral coupling, i.e., when two coils are placed side by side (e.g., on a same physical layer or different layer of the chip), or vertical coupling, i.e., when two coils are placed right on top of each other.

Figure 15:
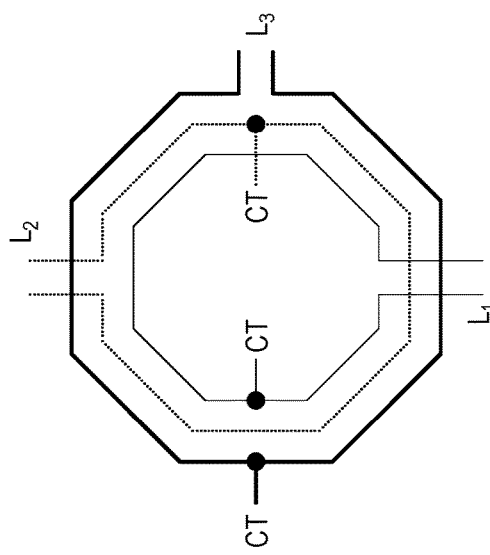
FIG. 15 depicts an exemplary physical construction of the magnetic balun/transformer having L1, L2 windings either laterally coupled or vertically coupled in the VCO circuit of FIGS. 2-6.

FIG. 15 is illustrative of the lateral coupling of three inductors L1, L2 and L3 fabricated on a semiconductor integrated circuit with designation CT indicating the center tap or common mode terminal which can be used to apply voltage or current, or can be used to sense a voltage for testing circuits. Each of the coils can be rotated relative to each other to facilitate easy coupling with active circuits under consideration. These rotations can be performed in steps of 45 degrees to fabricate defect free structures according to the rules of modern lithography. As shown in FIG. 15, inductor labeled L1 can be a single metal layer or sandwich of two or more metal layers, L2 can be a single metal layer or sandwich or two metal layers and L3 can be a single metal layer or sandwich or two metal layers. When fabricated a vertical coupling, the coils L2 and L3 of FIG. 12 are formed directly on top of each other using different metal layers. For example, inductor L2 can be at a metal level N, and inductor L3 can be at a metal level N−1 while inductor L1 can be sandwiched between a metal level N and metal level N−1.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A voltage controlled oscillator (VCO), comprising:
   an active negative transconductance circuit comprising: cross-coupled transistors having drains connected with a resonant tank circuit; the resonant tank circuit comprising:
   a first variable capacitor element having first and second ends connected to respective first ends of respective first coils of a respective first and second magnetic balun, and respective second ends of respective first coils of respective first and second magnetic baluns being connected to a first reference supply voltage; and
   a second variable capacitor element having a first end and a second end connected to a respective first end of a respective second coil of each said respective first and second magnetic baluns, and respective second ends of respective second coils of respective first and second magnetic baluns being connected to a second reference supply voltage, and
   a bias current circuit for sourcing or sinking a bias current through the resonant tank circuit and the active negative transconductance circuit to generate an oscillating signal, said tank circuit providing a low parasitic capacitance coupling structure and said first and second reference supply voltages each providing a voltage offset for extending a linear characteristic of a frequency tuning range of said oscillator.

2. The VCO of claim 1, integrated within a phase locked loop of an integrated circuit, said tank circuit further comprising: a digitally controlled capacitance array for providing a coarse tuning adjustment of a PLL frequency in response to an applied digital code word.

3. The VCO of claim 2, further comprising: a hardware controller for providing said digital code word to enable switching devices to switch in or out one or more capacitors of said digitally controlled capacitance array for said coarse tuning adjustment.

4. The VCO of claim 1, wherein the magnetic balun comprises a laterally coupled magnetic transformer.

5. The VCO of claim 1, wherein the magnetic balun comprises a vertically coupled magnetic transformer.

6. The VCO of claim 1, wherein the first reference voltage supply applied to the first magnetic balun, the second reference voltage supply applied to the second magnetic balun, or both said first and second reference voltage supplies are applied at the center tap of the respective first and second magnetic baluns.

7. The VCO of claim 1, wherein the cross-coupled transistors comprise n-channel metal oxide semiconductor (NMOS) field effect transistors, p-channel metal oxide semiconductor (NMOS) field effect transistors, or an NMOS and a PMOS field effect transistor.

8. The VCO of claim 2, further comprising: one or more charge pumps, each charge pump responsive to a control signal for applying a voltage to first variable capacitor element, the second variable capacitor element, or both first and second variable capacitor elements.

9. A voltage controlled oscillator (VCO), comprising:
a first active negative transconductance circuit comprising: cross-coupled transistors having drains connected with a resonant tank circuit;
a second active negative transconductance circuit comprising: cross-coupled transistors having drains connected with the resonant tank circuit;
the resonant tank circuit comprising:
a first variable capacitor element having first and second ends connected to respective first ends of respective first coils of a respective first and second magnetic balun, and respective second ends of respective first coils of respective first and second magnetic baluns being connected to a reference supply voltage; and
a second variable capacitor element having at least one first end connected to a respective first end of a respective second coil of said respective first and second magnetic baluns, and respective second ends of respective second coils of respective first and second magnetic baluns being connected to a virtual signal ground, wherein said second active negative transconductance circuit drains connect to said respective first ends of respective second coils of said respective first and second magnetic baluns; and
a bias current circuit for sourcing or sinking a bias current through the resonant tank circuit, the first active negative transconductance circuit and the second active negative transconductance circuit to generate an oscillating signal, said tank circuit providing a low parasitic capacitance coupling structure and said reference supply voltage providing a voltage offset for extending a linear characteristic of a frequency tuning range of said oscillator.

10. The VCO of claim 9, integrated within a phase locked loop of an integrated circuit, said tank circuit further comprising: a digitally controlled capacitance array for providing a coarse tuning adjustment of a PLL frequency in response to an applied digital code word.

11. The VCO of claim 10, further comprising: a hardware controller for providing said digital code word to enable switching devices to switch in or out one or more capacitors of said digitally controlled capacitance array for said coarse tuning adjustment.

12. The VCO of claim 9, wherein the magnetic balun comprises a laterally coupled magnetic transformer.

13. The VCO of claim 9, wherein the magnetic balun comprises a vertically coupled magnetic transformer.

14. The VCO of claim 9, wherein the reference voltage supply applied to the first magnetic balun is applied at the center tap of the respective first and second magnetic baluns.

15. The VCO of claim 9, wherein the cross-coupled transistors comprise n-channel metal oxide semiconductor (NMOS) field effect transistors, p-channel metal oxide semiconductor (NMOS) field effect transistors, or an NMOS and a PMOS field effect transistor.

16. The VCO of claim 10, further comprising: one or more charge pumps, each charge pump responsive to a control signal for applying a voltage to first variable capacitor element, the second variable capacitor element, or both first and second variable capacitor elements.

17. A method of operating a voltage controlled oscillator (VCO), the method comprising:
receiving a bias current at an active circuit comprising cross-coupled transistors having drains connected with a resonant tank circuit, said active circuit presenting a negative transconductance condition for generating an oscillating signal responsive to the bias current, said tank circuit comprising:
a first variable capacitor element having first and second ends connected to respective first ends of respective first coils of a respective first and second magnetic balun, and
a second variable capacitor element having at least one first end connected to a respective first end of respective second coil of said respective first and second magnetic baluns,
applying a first bias voltage to said first variable capacitor element via respective second ends of respective first coils of the respective first and second magnetic balun; and
applying a second bias voltage to said second variable capacitor element via respective second ends of respective second coils of the respective first and second magnetic balun,
said first and second bias voltages each providing a voltage offset for extending a linear characteristic of a frequency tuning range of said oscillator.

18. The method of claim 17, wherein said VCO is integrated within a phase locked loop (PLL) of an integrated circuit, said tank circuit further comprising: a digitally controlled capacitance array, said method further comprising:
applying a digital code word to configure said capacitance array to provide a coarse tuning adjustment of a PLL frequency.

19. The method of claim 18, wherein said digitally controlled capacitance array comprises one or more switch elements, said method further comprising:
switching in or out, responsive to said applied digital code word, one or more capacitors of said capacitance array for said coarse tuning PLL frequency adjustment.

20. The method of claim 17, further comprising:
applying, responsive to a received control signal at a charge pump, a voltage output of the charge pump to the first variable capacitor element, the second variable capacitor element, or both first and second variable capacitor elements, for fine tuning a PLL frequency.

* * * * *